United States Patent
Choi et al.

(10) Patent No.: US 11,974,456 B2
(45) Date of Patent: Apr. 30, 2024

(54) DISPLAY PANEL

(71) Applicant: SAMSUNG DISPLAY CO., LTD., Yongin-si (KR)

(72) Inventors: Wonwoo Choi, Yongin-si (KR); Wooyong Sung, Yongin-si (KR); Sooyoun Kim, Yongin-si (KR); Junghan Seo, Yongin-si (KR); Seoyeon Lee, Yongin-si (KR); Hyoungsub Lee, Yongin-si (KR); Moonwon Chang, Yongin-si (KR); Seunggun Chae, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 19 days.

(21) Appl. No.: 17/817,429

(22) Filed: Aug. 4, 2022

(65) Prior Publication Data

US 2022/0393137 A1 Dec. 8, 2022

Related U.S. Application Data

(63) Continuation of application No. 17/106,719, filed on Nov. 30, 2020, now Pat. No. 11,424,429, which is a
(Continued)

(30) Foreign Application Priority Data

Oct. 11, 2018 (KR) .................. 10-2018-0121197

(51) Int. Cl.
*H10K 50/844* (2023.01)
*H10K 59/12* (2023.01)
*H10K 59/88* (2023.01)

(52) U.S. Cl.
CPC .......... *H10K 50/844* (2023.02); *H10K 59/12* (2023.02); *H10K 59/88* (2023.02)

(58) Field of Classification Search
None
See application file for complete search history.

(56) References Cited

U.S. PATENT DOCUMENTS 8,350,266 B2 * 1/2013 Ahn ............... H01L 27/124
257/E29.151
9,825,103 B2 11/2017 Rappoport et al.
(Continued)

FOREIGN PATENT DOCUMENTS

| CN | 107579171 A | 1/2018 |
| JP | H08-315981 | 11/1996 |

(Continued)

OTHER PUBLICATIONS

Office Action dated May 8, 2020 in Corresponding U.S. Appl. No. 16/401,536.
(Continued)

*Primary Examiner* — Hung K Vu
(74) *Attorney, Agent, or Firm* — F. Chau & Associates, LLC

(57) ABSTRACT

A display panel includes a plurality of display elements arranged in a display area, an opening, a multi-layer including a first layer and a second layer disposed on the first layer, and a groove. Each display element includes a pixel electrode, an emission layer disposed on the pixel electrode, and an opposite electrode disposed on the emission layer. The display area surrounds the opening. The groove is located between the opening and the display area. The groove has an undercut cross-section that is concave in a thickness direction of the multi-layer, the second layer includes a pair of tips that protrude toward a center of the groove, and a length of each tip is less than about 2 μm.

27 Claims, 20 Drawing Sheets

Related U.S. Application Data continuation of application No. 16/401,536, filed on May 2, 2019, now Pat. No. 10,862,068.

(56) References Cited

U.S. PATENT DOCUMENTS

| | | |
|---|---|---|
| 9,997,738 B2 | 6/2018 | Choi et al. |
| 10,108,149 B2 | 10/2018 | Kang et al. |
| 10,128,461 B2 | 11/2018 | Kang et al. |
| 10,193,102 B2 | 1/2019 | Kanaya |
| 10,199,435 B2 | 2/2019 | Shimizu |
| 10,199,448 B2 | 2/2019 | Kim et al. |
| 10,454,067 B2 | 10/2019 | Seo et al. |
| 10,862,068 B2 | 12/2020 | Choi et al. |
| 2017/0026553 A1 | 1/2017 | Lee et al. |
| 2017/0031323 A1 | 2/2017 | Kim et al. |
| 2017/0148856 A1 | 5/2017 | Choi et al. |
| 2017/0150618 A1 | 5/2017 | Choi et al. |
| 2017/0162111 A1 | 6/2017 | Kang et al. |
| 2017/0162637 A1 | 6/2017 | Choi et al. |
| 2017/0237037 A1 | 8/2017 | Choi et al. |
| 2017/0288004 A1* | 10/2017 | Kim .............. H10K 77/10 |
| 2018/0033830 A1 | 2/2018 | Kim et al. |
| 2018/0069063 A1 | 3/2018 | Kim et al. |
| 2018/0190934 A1 | 7/2018 | Choi et al. |
| 2019/0181199 A1* | 6/2019 | Choi .............. H10K 50/844 |
| 2020/0020752 A1 | 1/2020 | Shi et al. |
| 2020/0119304 A1 | 4/2020 | Choi et al. |
| 2021/0126060 A1 | 4/2021 | Koo et al. |
| 2021/0143370 A1 | 5/2021 | Choi et al. |
| 2021/0320276 A1 | 10/2021 | Chang et al. |

FOREIGN PATENT DOCUMENTS

| | | |
|---|---|---|
| JP | H11-329749 | 11/1999 |
| JP | 2006-040801 | 2/2006 |
| JP | 2008-010275 | 1/2008 |
| JP | 2016-219125 | 12/2016 |
| JP | 2018-087863 | 6/2018 |
| JP | 2020-061354 | 4/2020 |
| JP | 2021-067949 | 4/2021 |
| JP | 2021-532561 | 11/2021 |
| KR | 10-2011-0058356 | 6/2011 |
| KR | 10-2016-0076688 | 7/2016 |
| KR | 10-2016-0147116 | 12/2016 |
| KR | 10-2017-0019553 | 2/2017 |
| KR | 10-2017-0059527 | 5/2017 |
| KR | 10-2017-0059537 | 5/2017 |
| KR | 10-2017-0059864 | 5/2017 |
| KR | 10-2017-0065059 | 6/2017 |
| KR | 10-2017-0066767 | 6/2017 |
| KR | 10-2017-0095444 | 8/2017 |
| KR | 10-2017-0128742 | 11/2017 |
| KR | 10-2018-0002126 | 1/2018 |
| KR | 10-2018-0014398 | 2/2018 |
| KR | 10-2018-0026599 | 3/2018 |
| KR | 10-2018-0062155 | 6/2018 |
| KR | 10-2018-0077767 | 7/2018 |

OTHER PUBLICATIONS

Office Action dated Jan. 6, 2022 in Corresponding U.S. Appl. No. 17/106,719.

* cited by examiner

DISPLAY PANEL

CROSS-REFERENCE TO RELATED APPLICATIONS

This application is a continuation of U.S. patent application Ser. No. 17/106,719 filed Nov. 30, 2020, which is a continuation of U.S. patent application Ser. No. 16/401,536 filed May 2, 2019 issued as U.S. Pat. No. 10,862,068 on Dec. 8, 2020, which claims priority under 35 U.S.C. § 119 to Korean Patent Application No. 10-2018-0121197, filed on Oct. 11, 2018 in the Korean Intellectual Property Office, the disclosures of which are incorporated by reference herein in their entirety.

TECHNICAL FIELD

Exemplary embodiments relate to a display panel including a groove and a display device including the display panel.

DISCUSSION OF THE RELATED ART

As display devices have become thinner and more lightweight, their range of use has been increasing.

As the area occupied by a display area of display devices increases, functions that may be combined or associated with the display device are being added. As a way of adding various functions while increasing the display area, research into a display device including an opening in the display area is in progress.

SUMMARY

In a display device including an opening, foreign substances such as moisture may penetrate through a lateral side of the opening. In this case, display elements adjacent to the opening may be damaged.

Exemplary embodiments include a display panel having a structure that may prevent passage of moisture through an opening, and a display device including the display panel.

According to an exemplary embodiment, a display panel includes a plurality of display elements arranged in a display area. Each display element includes a pixel electrode, an emission layer disposed on the pixel electrode, and an opposite electrode disposed on the emission layer. The display panel further includes an opening. The display area surrounds the opening. The display panel further includes a multi-layer including a first layer and a second layer disposed on the first layer, and a groove located between the opening and the display area. The groove has an undercut cross-section that is concave in a thickness direction of the multi-layer, the second layer includes a pair of tips that protrude toward a center of the groove, and a length of each tip is less than about 2 μm.

In an exemplary embodiment, the length of each tip is about equal to or greater than about 0.3 μm and less than about 2 μm.

In an exemplary embodiment, the first layer includes an organic material and the second layer includes an inorganic material.

In an exemplary embodiment, the second layer includes an inorganic insulating layer or a metal layer.

In an exemplary embodiment, the groove includes a first hole or a first recess formed in the first layer, and a second hole formed in the second layer. The second hole is connected to the first hole or the first recess.

In an exemplary embodiment, a distance between the pair of tips is greater than a depth of the first hole or the first recess.

In an exemplary embodiment, a depth of the first hole or the first recess is greater than the length of each tip.

In an exemplary embodiment, the length of each tip relative to the depth of the first hole or the first recess is about $0.05 < (\ell/dp) < $ about $0.50$, where $\ell$ is the length of each tip and dp is the depth of the first hole or the first recess.

In an exemplary embodiment, a depth of the first hole or the first recess is about equal to or less than a thickness of the first layer.

In an exemplary embodiment, the display panel further includes a first functional layer disposed between the pixel electrode and the emission layer, and/or a second functional layer disposed between the emission layer and the opposite electrode. The first functional layer and/or the second functional layer is disconnected around the pair of tips, and the opposite electrode is disconnected around the pair of tips. A depth of the first hole or the first recess is greater than a sum of a thickness of the first functional layer and/or the second functional layer and a thickness of the opposite electrode.

In an exemplary embodiment, the display panel further includes a capping layer disposed on the opposite electrode. The depth of the first hole or the first recess is greater than a sum of the thickness of the first functional layer and/or the second functional layer, the thickness of the opposite electrode, and a thickness of the capping layer.

In an exemplary embodiment, the display panel further includes a substrate and a pixel circuit disposed on the substrate. The pixel circuit includes a thin film transistor electrically connected to the pixel electrode.

In an exemplary embodiment, the substrate includes the multi-layer.

In an exemplary embodiment, the multi-layer is disposed on the substrate.

According to an exemplary embodiment, a display panel includes an opening and a plurality of display elements. Each display element includes a pixel electrode, an emission layer, and an opposite electrode. The plurality of display elements is located in a display area surrounding the opening. The display panel further includes a multi-layer including a first layer and a second layer disposed on the first layer, and a groove located between the opening and the display area and having an undercut cross-section. The groove is provided in a thickness direction of the multi-layer, the second layer includes a pair of tips that protrude toward a center of the groove, and a depth of a portion of the groove that passes through the first layer is greater than a length of each tip.

In an exemplary embodiment, the length of each tip is about equal to or greater than about 0.3 μm and less than about 2 μm.

In an exemplary embodiment, the depth is about equal to or less than a thickness of the first layer.

In an exemplary embodiment, a distance between the pair of tips is greater than the depth.

In an exemplary embodiment, the length of each tip relative to the depth is about $0.05 < (\ell/dp) < $ about $0.50$, where $\ell$ is the length of each tip and dp is the depth.

In an exemplary embodiment, the display panel further includes a first functional layer disposed between the pixel electrode and the emission layer, and/or a second functional layer disposed between the emission layer and the opposite electrode. The first functional layer and/or the second functional layer is disconnected around the pair of tips, and the opposite electrode is disconnected around the pair of tips.

The depth is greater than a sum of a thickness of the first functional layer and/or the second functional layer and a thickness of the opposite electrode.

In an exemplary embodiment, the display panel further includes a capping layer disposed on the opposite electrode. The depth is greater than a sum of the thickness of the first functional layer and/or the second functional layer, the thickness of the opposite electrode, and a thickness of the capping layer.

In an exemplary embodiment, the depth is about 2 μm or more.

In an exemplary embodiment, the display panel further includes a substrate and a pixel circuit disposed on the substrate. The pixel circuit includes a thin film transistor electrically connected to the pixel electrode.

In an exemplary embodiment, the substrate includes the multi-layer.

In an exemplary embodiment, the multi-layer is disposed on the substrate.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION

Figure 1:
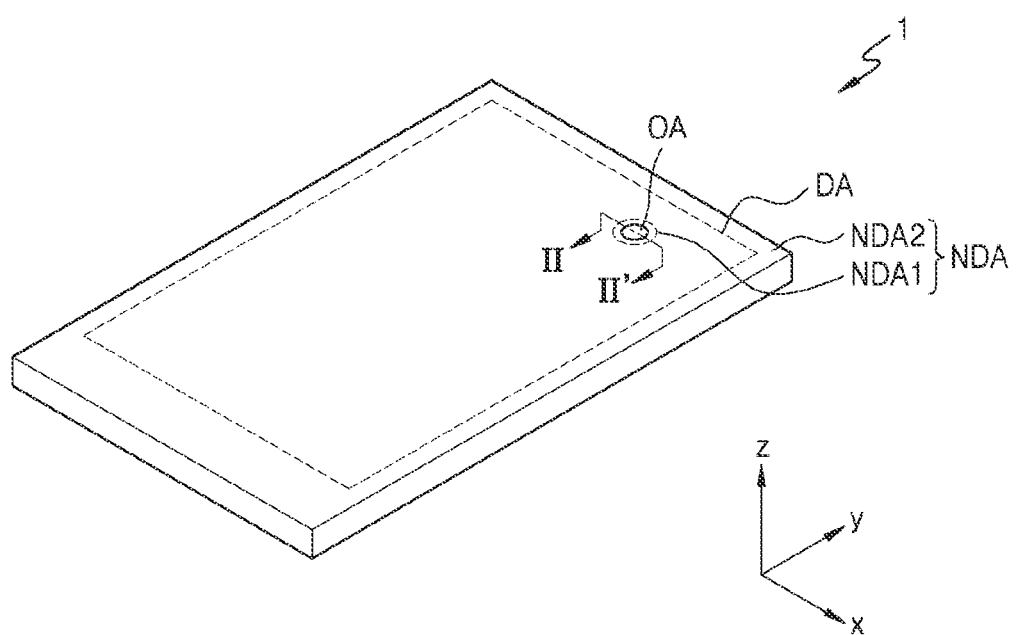
FIG. 1 is a perspective view of a display device according to an exemplary embodiment.

Exemplary embodiments of the present disclosure will be described more fully hereinafter with reference to the accompanying drawings. Like reference numerals may refer to like elements throughout the accompanying drawings.

As used herein, the term "and/or" includes any and all combinations of one or more of the associated listed items. For example, "at least one of a, b or c" may be understood as referring to only a, only b, only c, both a and b, both a and c, both b and c, and all of a, b, and c, or variations thereof.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

When a certain embodiment may be implemented differently, a specific process order may be performed differently from the described order. For example, two consecutively described processes may be performed substantially at the same time or performed in an order opposite to the described order.

The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

FIG. 1 is a perspective view of a display device 1 according to an exemplary embodiment.

Referring to FIG. 1, the display device 1 includes a display area DA that emits light, and a non-display area NDA that does not emit light. The non-display area NDA neighbors the display area DA. The display device 1 may provide a predetermined image by using light emitted from a plurality of pixels arranged in the display area DA.

The display device 1 includes an opening area OA that is at least partially surrounded by the display area DA. In an exemplary embodiment, the opening area OA is entirely surrounded by the display area DA, as shown in FIG. 1. The non-display area NDA may include a first non-display area NDA1 surrounding the opening area OA, and a second non-display area NDA2 surrounding an outer periphery of the display area DA. The first non-display area NDA1 may entirely surround the opening area OA, the display area DA may entirely surround the first non-display area NDA1, and the second non-display area NDA2 may entirely surround the display area DA.

Although an organic light-emitting display device is exemplarily described as the display device 1 according to an exemplary embodiment below, the display device is not limited thereto. For example, in an exemplary embodiment, various types of display devices such as an inorganic light-emitting display and a quantum dot light-emitting display may be used.

Figure 2:
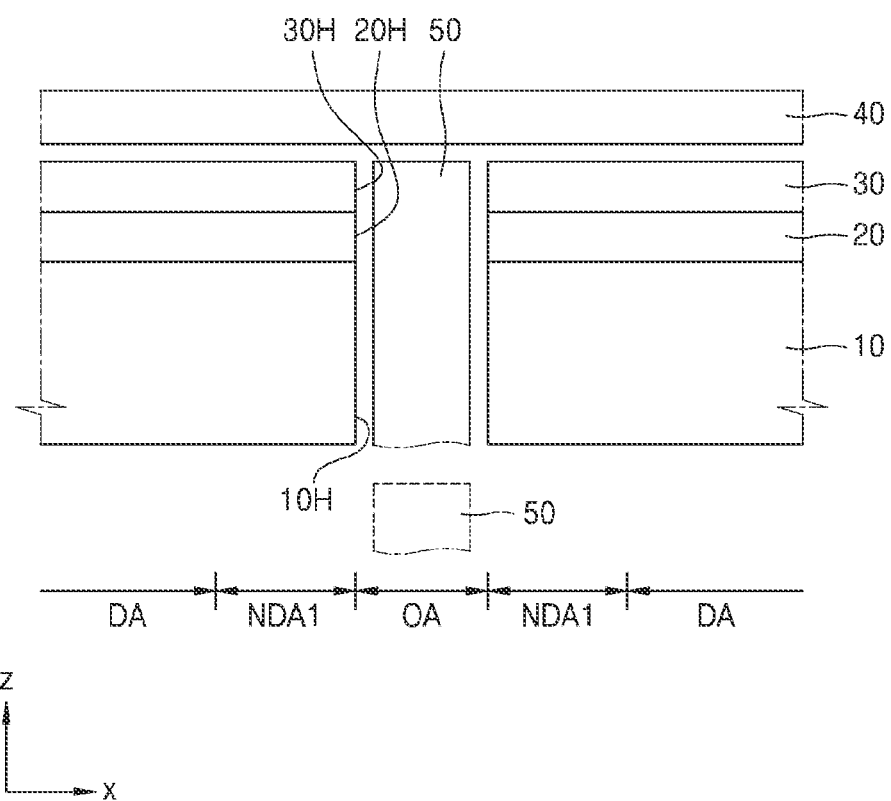
FIG. 2 is a cross-sectional view of a display device according to an exemplary embodiment.

FIG. 2 is a cross-sectional view of a display device according to an exemplary embodiment, and may correspond to a cross-section taken along line II-IT of FIG. 1.

Referring to FIG. 2, the display device 1 may include a display panel 10, an input sensing member 20 arranged on the display panel 10, and an optical functional member 30. These members may be covered by a window 40. The display device 1 may include various electronic devices such as, for example, mobile phones, notebook computers, and smartwatches.

The display panel 10 may display an image. The display panel 10 includes pixels arranged in the display area DA. Each of the pixels may include a display element and a pixel circuit connected thereto. The display element may include, for example, an organic light-emitting diode, an inorganic light-emitting diode, or a quantum dot light-emitting diode.

The input sensing member 20 obtains coordinate information corresponding to an external input such as, for example, a touch event. The input sensing member 20 may include a sensing electrode (or a touch electrode) and a trace line connected to the sensing electrode. The input sensing member 20 may be arranged on the display panel 10.

The input sensing member 20 may be directly formed on the display panel 10 or may be formed separately and then coupled to the display panel 10 using, for example, an adhesive layer such as an optical clear adhesive (OCA). For example, the input sensing member 20 may be successively formed after a process of forming the display panel 10. In this case, in an exemplary embodiment, the adhesive layer is not arranged between the input sensing member 20 and the display panel 10. Although FIG. 2 shows that the input sensing member 20 is arranged between the display panel 10 and the optical functional member 30, the present disclosure is not limited thereto. For example, in an exemplary embodiment, the input sensing member 20 may be arranged on the optical functional member 30.

The optical functional member 30 may include a reflection prevention layer. The reflection prevention layer may reduce reflectivity of light (external light) incident from the outside toward the display panel 10 through the window 40. The reflection prevention layer may include, for example, a retarder and a polarizer. The retarder may include a film type retarder or a liquid crystal type retarder. The retarder may include a $\lambda/2$ retarder and/or a $\lambda/4$ retarder. The polarizer may include a film type polarizer or a liquid crystal type polarizer. The film type polarizer may include a stretchable synthetic resin film, and the liquid crystal type polarizer may include liquid crystals arranged in a predetermined arrangement. Each of the retarder and the polarizer may further include a protective film. The retarder and the polarizer themselves or their protective films may be defined as a base layer of the reflection prevention layer.

In an exemplary embodiment, the reflection prevention layer may include a black matrix and color filters. The color filters may be arranged taking into account colors of light emitted respectively from pixels of the display panel 10. In an exemplary embodiment, the reflection prevention layer may include a destructive interference structure. The destructive interference structure may include a first reflection layer and a second reflection layer respectively arranged in different layers. First reflected light and second reflected light respectively reflected by the first reflection layer and the second reflection layer may be destructively interfered, and thus, reflectivity of external light may be reduced.

The optical functional member 30 may include a lens layer. The lens layer may improve emission efficiency of light emitted from the display panel 10 or reduce color deviation of the light. The lens layer may include a layer having a concave or convex lens shape and/or include a plurality of layers respectively having different refractive indexes. The optical functional member 30 may include both the reflection prevention layer and the lens layer, or include one of the reflection prevention layer and the lens layer.

The display panel 10, the input sensing member 20, and/or the optical functional member 30 may include an opening. In this regard, in an exemplary embodiment, the display panel 10, the input sensing member 20, and the optical functional member 30 may respectively include first to third openings 10H, 20H, and 30H that overlap each other, as shown in FIG. 2. The first to third openings 10H, 20H, and 30H are disposed in locations that correspond to the opening area OA. In an exemplary embodiment, at least one of the display panel 10, the input sensing member 20, or the optical functional member 30 does not include an opening. For example, in an exemplary embodiment, one or two of the display panel 10, the input sensing member 20, and the optical functional member 30 do not include an opening.

A component 50 may correspond to the opening area OA. For example, a component 50 may be disposed within or near the opening area OA. For example, the component 50 may be located inside the first to third openings 10H, 20H, and 30H, as indicated by a solid line in FIG. 2, or the component 50 may be located below the display panel 10 in alignment with the first to third openings 10H, 20H, and 30H, as indicated by the dashed line in FIG. 2.

The component 50 may include an electronic element. For example, the component 50 may include an electronic element that uses light or sound. For example, the electronic element may be a sensor such as an infrared sensor that emits and/or receives light, a camera that receives light and captures an image, a sensor that outputs and senses light or sound to measure a distance or recognize a fingerprint, a small lamp that outputs light, or a speaker that outputs sound. An electronic element that uses light may use light in various wavelength bands such as visible light, infrared light, and ultraviolet light. In an exemplary embodiment, the opening area OA may be understood as a transmission area through which light and/or sound, which are output from the component 50 to the outside or propagate toward the component 50 from the outside, may pass.

In an exemplary embodiment, in the case in which the display device 1 is used as a smartwatch or an instrument panel for an automobile, the component 50 may be a member including a needle of a clock or a needle, etc. indicating predetermined information (e.g. the velocity of a vehicle, etc.). In the case in which the display device 1 includes a needle of a clock or an instrument panel for an automobile, the component 50 may be exposed to the outside through the window 40, which may include an opening corresponding to the opening area OA.

As described above, the component 50 may include an element(s) related to a function of the display panel 10 or an element(s) such as an accessory that increases an aesthetic sense of the display panel 10.

Figure 3:
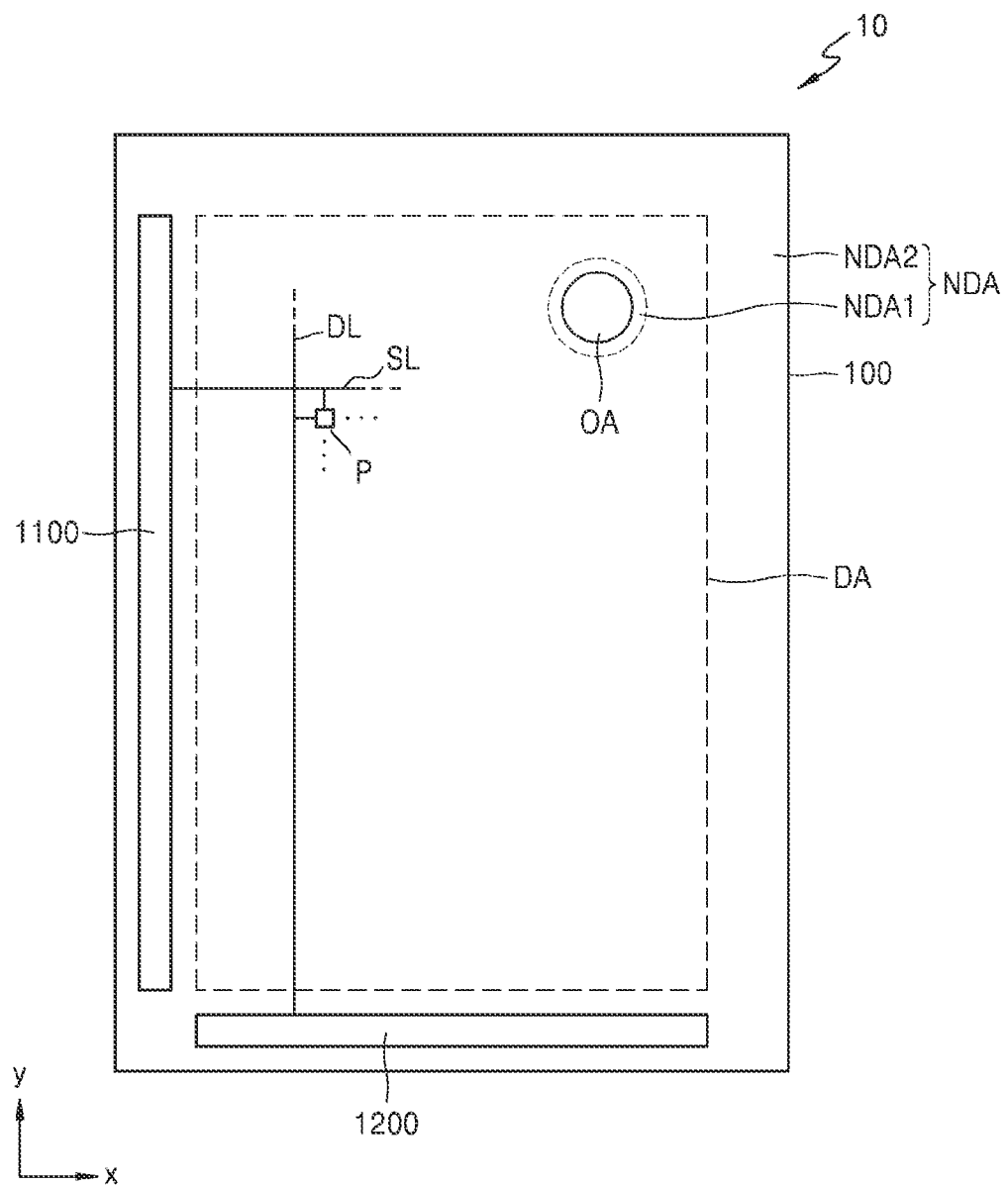
FIG. 3 is a plan view of a display panel according to an exemplary embodiment.
Figure 4:
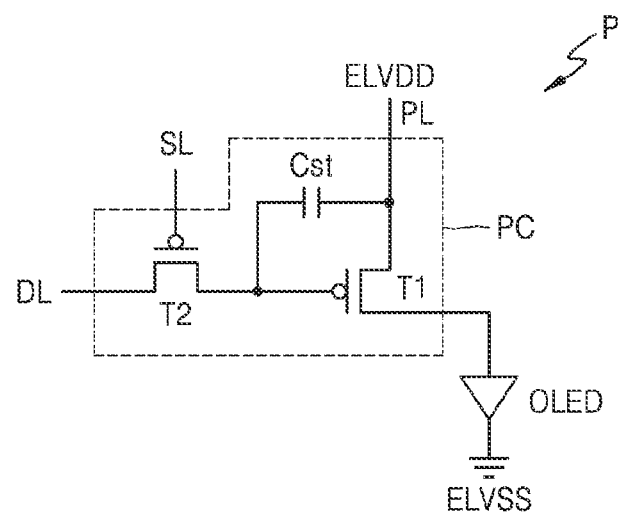
FIG. 4 is an equivalent circuit diagram of one of a plurality of pixels of a display panel.

FIG. 3 is a plan view of the display panel 10 according to an exemplary embodiment. FIG. 4 is an equivalent circuit diagram of one of a plurality of pixels of the display panel 10.

Referring to FIG. 3, the display panel 10 includes the display area DA and the first and second non-display areas NDA1 and NDA2. FIG. 3 illustrates a substrate 100 of the display panel 10. The substrate 100 of the display panel 10 includes the opening area OA, and the first and second non-display areas NDA1 and NDA2.

The display panel 10 includes a plurality of pixels P arranged in the display area DA. As shown in FIG. 4, each pixel P includes a pixel circuit PC and an organic light-emitting diode OLED as a display element connected to the pixel circuit PC. The pixel circuit PC may include a first thin film transistor T1, a second thin film transistor T2, and a storage capacitor Cst. Each pixel P may emit, for example, red, green, blue, or white light through the organic light-emitting diode OLED.

The second thin film transistor T2 may be a switching thin film transistor, may be connected to a scan line SL and a data line DL, and may transfer a data voltage that is input from the data line DL to the first thin film transistor T1 in response to a switching voltage input from the scan line SL. The storage capacitor Cst may be connected to the second thin film transistor T2 and a driving voltage line PL, and may store a voltage corresponding to a difference between a voltage transferred from the second thin film transistor T2 and a first power voltage ELVDD supplied to the driving voltage line PL.

The first thin film transistor T1 may be a driving thin film transistor, may be connected to the driving voltage line PL and the storage capacitor Cst, and may control a driving current flowing through the organic light-emitting diode OLED from the driving voltage line PL in response to a voltage value stored in the storage capacitor Cst. The organic light-emitting diode OLED may emit light having a predetermined brightness by using the driving current. An opposite electrode (e.g. a cathode) of the organic light-emitting diode OLED may receive a second power voltage ELVSS.

Although it is described with reference to FIG. 4 that the pixel circuit PC includes two thin film transistors and one storage capacitor, the present disclosure is not limited thereto. For example, according to exemplary embodiments, the number of thin film transistors and/or the number of storage capacitors may be variously changed depending on a design of the pixel circuit PC.

Referring again to FIG. 3, the first non-display area NDA1 may surround the opening area OA. The first non-display area NDA1 is an area in which a display element such as an organic light-emitting diode OLED is not arranged. Signal lines that provide a signal to pixels P provided around the opening area OA may pass across the first non-display area NDA1, or groove(s), which will be described below, may be arranged in the first non-display area NDAL A scan driver 1100 that provides a scan signal to each pixel P, a data driver 1200 that provides a data signal to each pixel P, a main power wiring that provides first and second power voltages ELVDD and ELVSS, etc. may be arranged in the second non-display area NDA2. Although it is shown in FIG. 3 that the data driver 1200 is adjacent to one lateral side of the substrate 100, the present disclosure is not limited thereto. For example, in an exemplary embodiment, the data driver 1200 may be arranged on a flexible printed circuit board (FPCB) electrically connected to a pad arranged on one side of the display panel 10.

Figure 5:
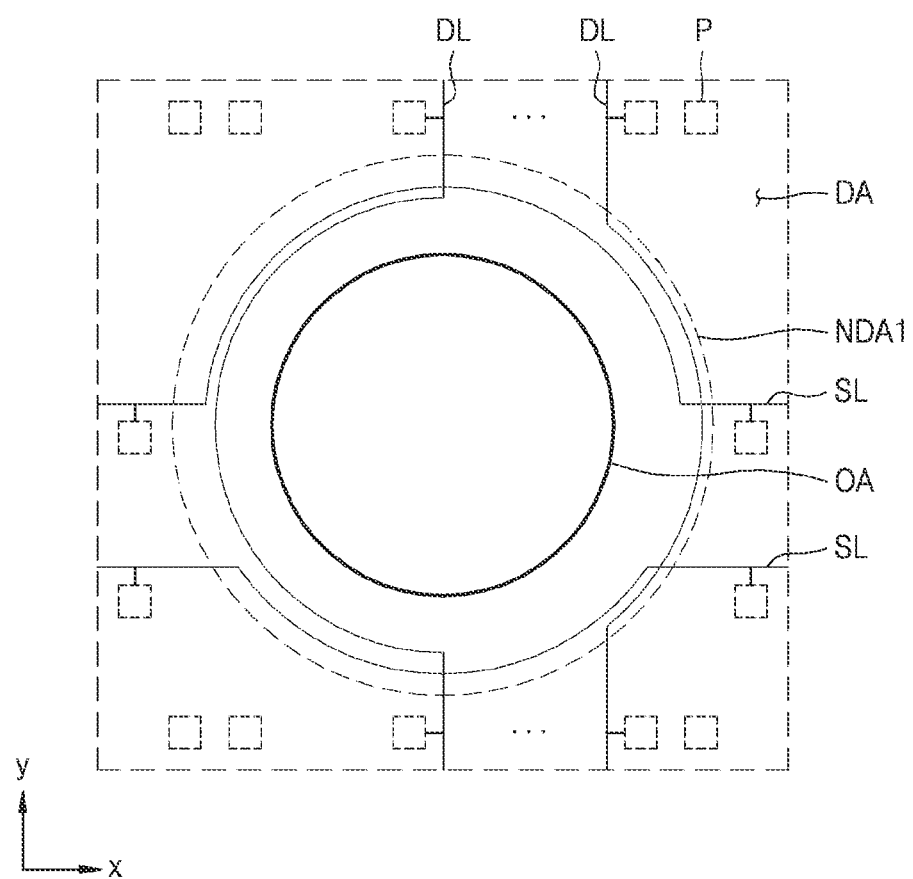
FIG. 5 is a view of signal lines located in a non-display area of a display panel according to an exemplary embodiment.

FIG. 5 is a plan view of a portion of the display panel 10 according to an exemplary embodiment, and shows signal lines located in the first non-display area NDA1.

Referring to FIG. 5, pixels P may be arranged with respect to the opening area OA in the display area DA, and the first non-display area NDA1 may be located between the opening area OA and the display area DA.

Pixels P may be spaced apart from each other with respect to the opening area OA. In a plan view, the pixels P may be arranged vertically in a y-direction with the opening area OA disposed therebetween, and/or arranged horizontally in an x-direction with the opening area OA disposed therebetween.

Signal lines that are adjacent to the opening area OA among signal lines that supply a signal to the pixels P may detour/bypass the opening area OA. Some data lines DL among data lines DL that pass across the display area DA may extend in the y-direction, provide a data signal to the pixels P arranged vertically with the opening area OA disposed therebetween, and detour/bypass along an edge of the opening area OA in the first non-display area NDA1. Some scan lines SL among scan lines SL that pass across the display area DA may extend in the x-direction, provide a scan signal to the pixels P arranged horizontally with the opening area OA disposed therebetween, and detour/bypass along an edge of the opening area OA in the first non-display area NDA 1.

Herein, when lines are described as detouring/bypassing the opening area OA, it is to be understood that the extension direction of the lines is adjusted such that the lines are disposed around the opening area OA and are not disposed within the opening area OA.

Figure 6:
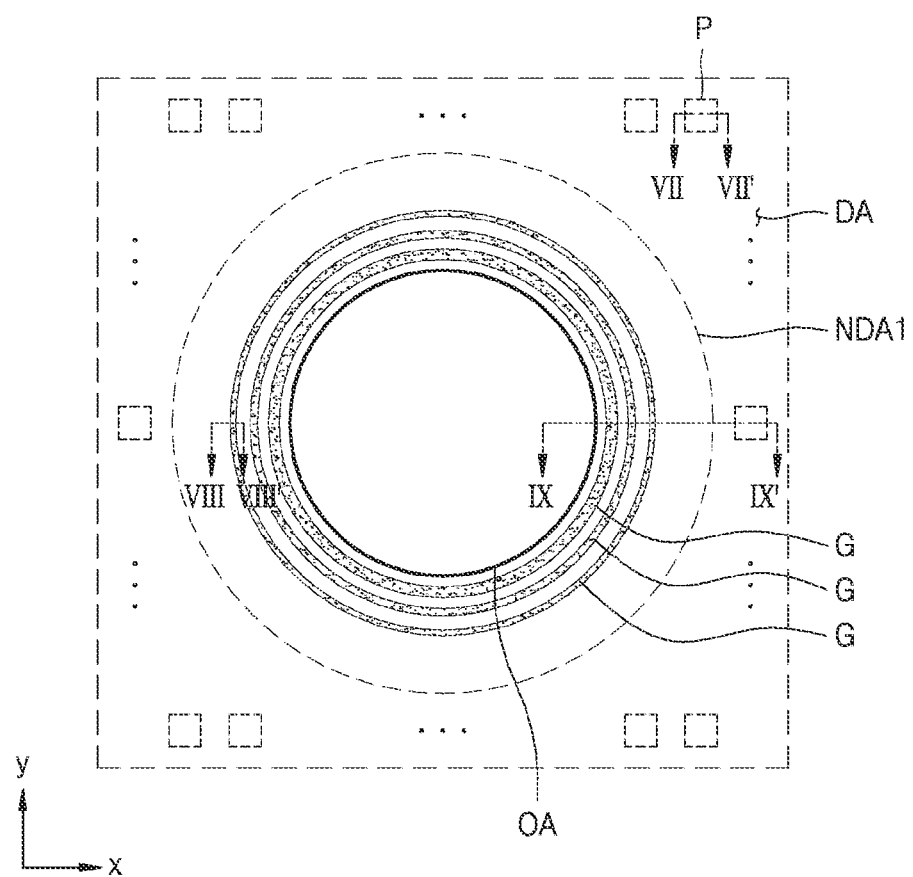
FIG. 6 is a view of grooves located in a first non-display area of a display panel according to an exemplary embodiment.

FIG. 6 is a plan view of a portion of the display panel 10 according to an exemplary embodiment, and shows grooves G located in the first non-display area NDA1.

One or more grooves G are located between the opening area OA and the display area DA. In this regard, although it is shown in FIG. 6 that three grooves G are located between the opening area OA and the display area DA, the present disclosure is not limited thereto. For example, in an exemplary embodiment, one, two, or four or more grooves G may be arranged in the first non-display area NDA1.

The grooves G may have a ring shape that entirely surrounds the opening area OA in the first non-display area NDA1 when viewed in a perpendicular direction of a main surface of the substrate 100. A diameter of each of the grooves G may be greater than a diameter of the opening area OA. The grooves G surrounding the opening area OA may be spaced apart from each other in a plan view.

Referring to FIGS. 5 and 6, the grooves G may be closer to the opening area OA than they are to detour/bypassing portions of the data lines and/or scan lines that detour/bypass an edge of the opening area OA. For example, a distance between the grooves G and the opening area OA may be smaller than a distance between the opening area OA and the detour/bypassing portions of the data lines and/or scan lines that detour/bypass an edge of the opening area OA.

Figure 7:
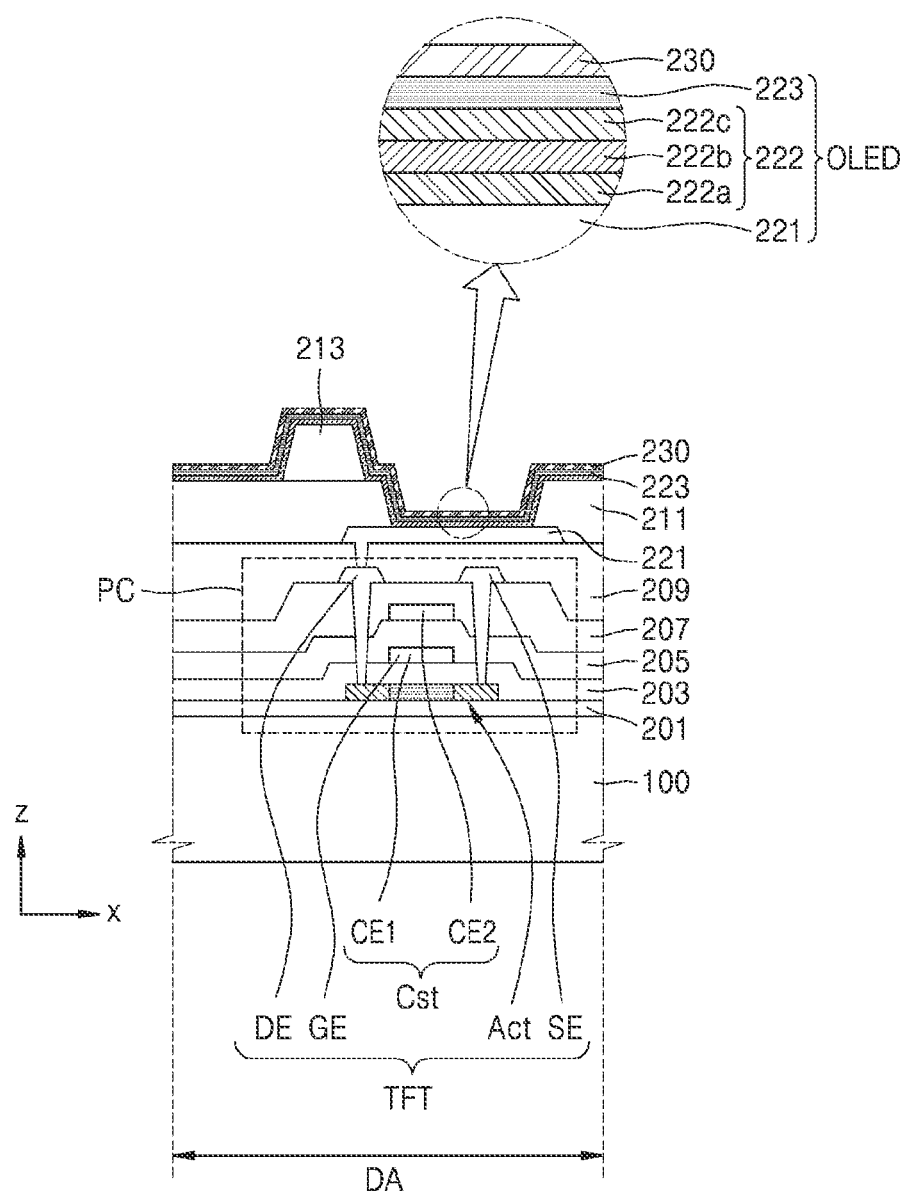
FIG. 7 is a cross-sectional view of one of a plurality of pixels of a display panel according to an exemplary embodiment.

FIG. 7 is a cross-sectional view of one of a plurality of pixels of the display panel 10 according to an exemplary embodiment, and may correspond to a cross-section taken along line VII-VII' of FIG. 6.

Referring to FIG. 7, the pixel circuit PC and the organic light-emitting diode OLED electrically connected to the pixel circuit PC may be arranged in the display area DA.

A thin film transistor TFT, a storage capacitor Cst, and a pixel electrode 221 electrically connected to the thin film transistor TFT and the storage capacitor Cst located over the substrate 100 are formed. The pixel circuit PC may be arranged over the substrate 100, and the organic light-emitting diode OLED may be located over the pixel circuit PC.

The substrate 100 may include, for example, a polymer resin or glass. In an exemplary embodiment, the substrate 100 may include a polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), and/or cellulose acetate propionate (CAP). The substrate 100 may be flexible. The substrate 100 may include a glass material containing $SiO_2$ as a main component, or may include a resin such as a reinforced plastic, and may have a rigid characteristic.

A buffer layer 201 configured to prevent impurities from penetrating into a semiconductor layer Act of the thin film transistor TFT may be arranged on the substrate 100. The buffer layer 201 may include an inorganic insulating material such as, for example, silicon nitride or silicon oxide, and may include a single layer or a multi-layer including the inorganic insulating material.

The pixel circuit PC may be arranged on the buffer layer 201. The pixel circuit PC includes the thin film transistor TFT and the storage capacitor Cst. The thin film transistor TFT may include the semiconductor layer Act, a gate electrode GE, a source electrode SE, and a drain electrode DE. The thin film transistor TFT shown in FIG. 7 may correspond to the driving thin film transistor described with reference to FIG. 4. Although the exemplary embodiment illustrated in FIG. 7 shows a top-gate type thin film transistor in which the gate electrode GE is arranged over the semiconductor layer Act with a gate insulating layer 203 disposed therebetween, the present disclosure is not limited thereto. For example, in an exemplary embodiment, the thin film transistor TFT may include a bottom-gate type thin film transistor.

The semiconductor layer Act may include polycrystalline silicon. Alternatively, the semiconductor layer Act may include amorphous silicon, an oxide semiconductor, or an organic semiconductor. The gate electrode GE may include a low resistance metal material. The gate electrode GE may include a conductive material such as, for example, Mo, Al, Cu, and/or Ti, etc. The gate electrode GE may include a multi-layer or a single layer including the above-mentioned materials.

The gate insulating layer 203 disposed between the semiconductor layer Act and the gate electrode GE may include an inorganic insulating material such as, for example, silicon oxide, silicon nitride, silicon oxynitride, aluminum oxide, titanium oxide, tantalum oxide, and hafnium oxide. The gate insulating layer 203 may include a multi-layer or a single layer including the above-mentioned materials.

The source electrode SE and the drain electrode DE may include a material having excellent conductivity. Each of the source electrode SE and the drain electrode DE may include a conductive material including, for example, Mo, Al, Cu, and/or Ti, and may include a multi-layer or a single layer including the above-mentioned materials. In an exemplary embodiment, the source electrode SE and the drain electrode DE may include a triple-layer of Ti/Al/Ti.

The storage capacitor Cst includes a lower electrode CE1 and an upper electrode CE2 that overlap each other with a first interlayer insulating layer 205 disposed therebetween. The storage capacitor Cst may overlap the thin film transistor TFT. In this regard, it is shown in FIG. 7 that the gate electrode GE of the thin film transistor TFT serves as the lower electrode CE1 of the storage capacitor Cst. However, the present disclosure is not limited thereto. For example, in an exemplary embodiment, the storage capacitor Cst does not overlap the thin film transistor TFT. The storage capacitor Cst may be covered by a second interlayer insulating layer 207.

The first and second interlayer insulating layers 205 and 207 may include an inorganic insulating layer such as, for example, silicon oxide, silicon nitride, silicon oxynitride, aluminum oxide, titanium oxide, tantalum oxide, and hafnium oxide. The first and second interlayer insulating layers 205 and 207 may include a single layer or a multi-layer including the above-mentioned materials.

The pixel circuit PC including the thin film transistor TFT and the storage capacitor Cst may be covered by a first insulating layer 209. The first insulating layer 209 may include a planarization insulating layer and may include a substantially flat surface. The first insulating layer 209 may include an organic insulating material including an imide-based polymer, a general-purpose polymer such as polymethylmethacrylate (PMMA) and polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an exemplary embodiment, the first insulating layer 209 may include polyimide. Alternatively, the first insulating layer 209 may include an inorganic insulating material, or inorganic and organic insulating materials.

The pixel electrode 221 may be formed on the first insulating layer 209. The pixel electrode 221 may include a conductive oxide such as, for example, indium tin oxide (ITO), zinc oxide (IZO), zinc oxide (ZnO), indium oxide ($In_2O_3$), indium gallium oxide (IGO), or aluminum zinc oxide (AZO). In an exemplary embodiment, the pixel electrode 221 may include a reflective layer including, for example, Ag, Mg, Al, Pt, Pd, Au, Ni, Nd, Jr, Cr, and/or a compound thereof. In an exemplary embodiment, the pixel electrode 221 may further include a layer including, for example, ITO, IZO, ZnO, or $In_2O_3$ on/under the reflective layer.

A second insulating layer 211 may be formed on the pixel electrode 221. The second insulating layer 211 may include a pixel-defining layer. The second insulating layer 211 may include an opening that exposes a portion of a top surface of the pixel electrode 221, and may cover edges of the pixel electrode 221. The second insulating layer 211 may include an organic insulating material. Alternatively, the second insulating layer 211 may include an inorganic insulating material such as, for example, silicon nitride, silicon oxynitride, or silicon oxide. Alternatively, the second insulating layer may include an organic insulating material and an inorganic insulating material.

An intermediate layer 222 may include an emission layer 222b, a first functional layer 222a arranged under the emission layer 222b, and/or a second functional layer 222c arranged on the emission layer 222b. The emission layer 222b may include a low molecular or polymer organic material that emits light of a predetermined color.

The first functional layer 222a may include an organic layer. The first functional layer 222a may include a single layer or a multi-layer. For example, in the case in which the first functional layer 222a includes a polymer material, the first functional layer 222a includes a hole transport layer (HTL), which has a single-layered structure, and may include poly-(3,4)-ethylene-dihydroxy thiophene (PEDOT) or polyaniline (PANI). In the case in which the first functional layer 222a includes a low molecular material, the first functional layer 222a may include a hole injection layer (HIL) and an HTL.

The second functional layer 222c may include an organic layer. In an exemplary embodiment, the second functional layer 222c may be omitted. For example, in the case in which the first functional layer 222a and the emission layer 222b include a polymer material, the second functional layer 222c may be provided. The second functional layer 222c may be a single layer or a multi-layer. The second functional layer 222c may include an electron transport layer (ETL) and/or an electron injection layer (EIL).

The emission layer 222b of the intermediate layer 222 may be arranged every pixel P in the display area DA. The first and second functional layers 222a and 222c of the intermediate layer 222 may be provided in not only the display area DA of FIG. 7, but also in the first non-display area NDA1, which will be described with reference to FIGS. 8A and 8B.

An opposite electrode 223 may include a conductive material having a low work function. For example, the opposite electrode 223 may include a semi-transparent layer including, for example, Ag, Mg, Al, Pt, Pd, Au, Ni, Nd, Jr, Cr, Li, Ca, or an alloy thereof. Alternatively, the opposite electrode 223 may further include a layer including, for example, ITO, IZO, ZnO, or $In_2O_3$ on the semi-transparent layer including the above-mentioned material. The opposite electrode 223 may be provided in not only the display area DA, but also in the first non-display area NDA1. The intermediate layer 222 and the opposite electrode 223 may be formed by a deposition method.

A spacer 213 may be provided on the second insulating layer 211. The spacer 213 may include an organic insulating material such as, for example, polyimide. Alternatively, the spacer 213 may include an inorganic insulating material such as, for example, silicon nitride or silicon oxide, or may include an organic insulating material and an inorganic insulating material.

The spacer 213 may include a material different from that of the second insulating layer 211. Alternatively, the spacer 213 may include the same material as that of the second insulating layer 211. In this case, the second insulating layer 211 and the spacer 213 may be simultaneously formed during a mask process that uses, for example, a half-tone mask. In an exemplary embodiment, the second insulating layer 211 and the spacer 213 may include polyimide.

A capping layer 230 may be arranged on the opposite electrode 223. The capping layer 230 may include LiF, an inorganic material and/or an organic material. In an exemplary embodiment, the capping layer 230 may be omitted.

FIGS. 8A to 8D are cross-sectional views of one of the grooves G of the display panel 10 according to an exemplary embodiment, and may correspond to a cross-section taken along line VIII-VIII' of FIG. 6.

Figure 8A:
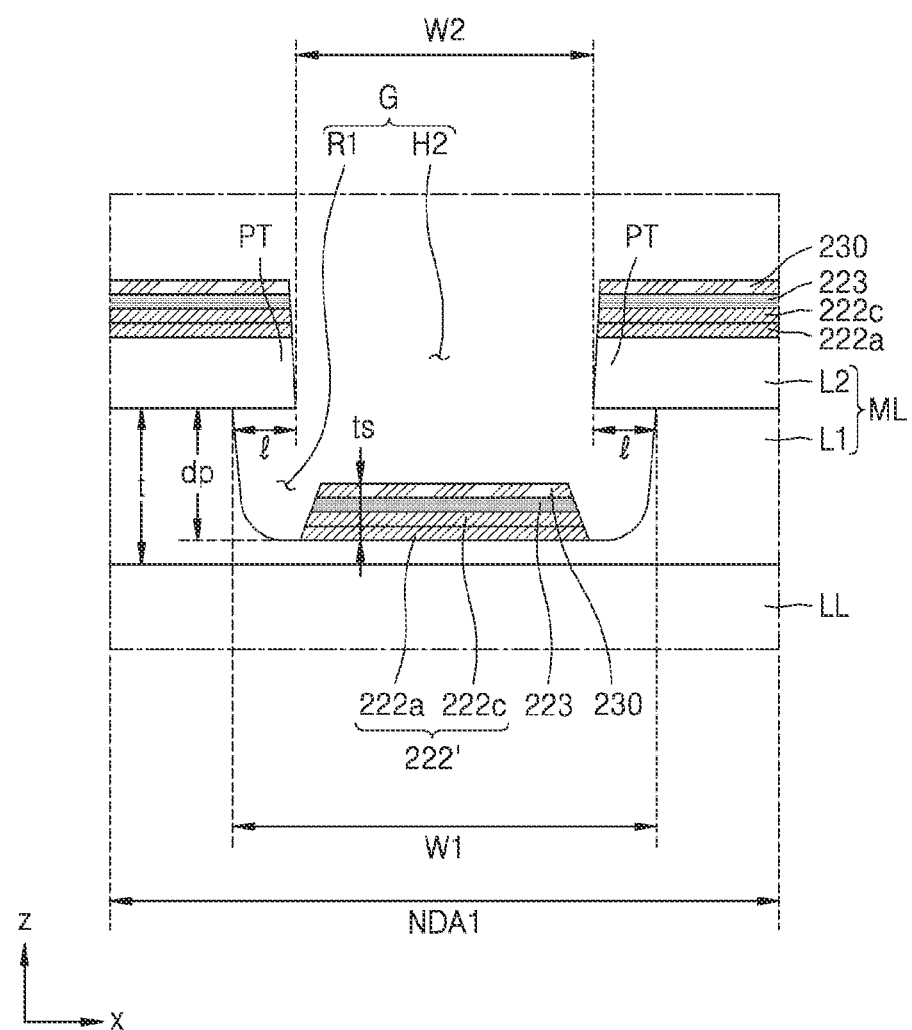
FIGS. 8A to 8D are cross-sectional views of a groove of a display panel according to an exemplary embodiment.
Figure 8B:
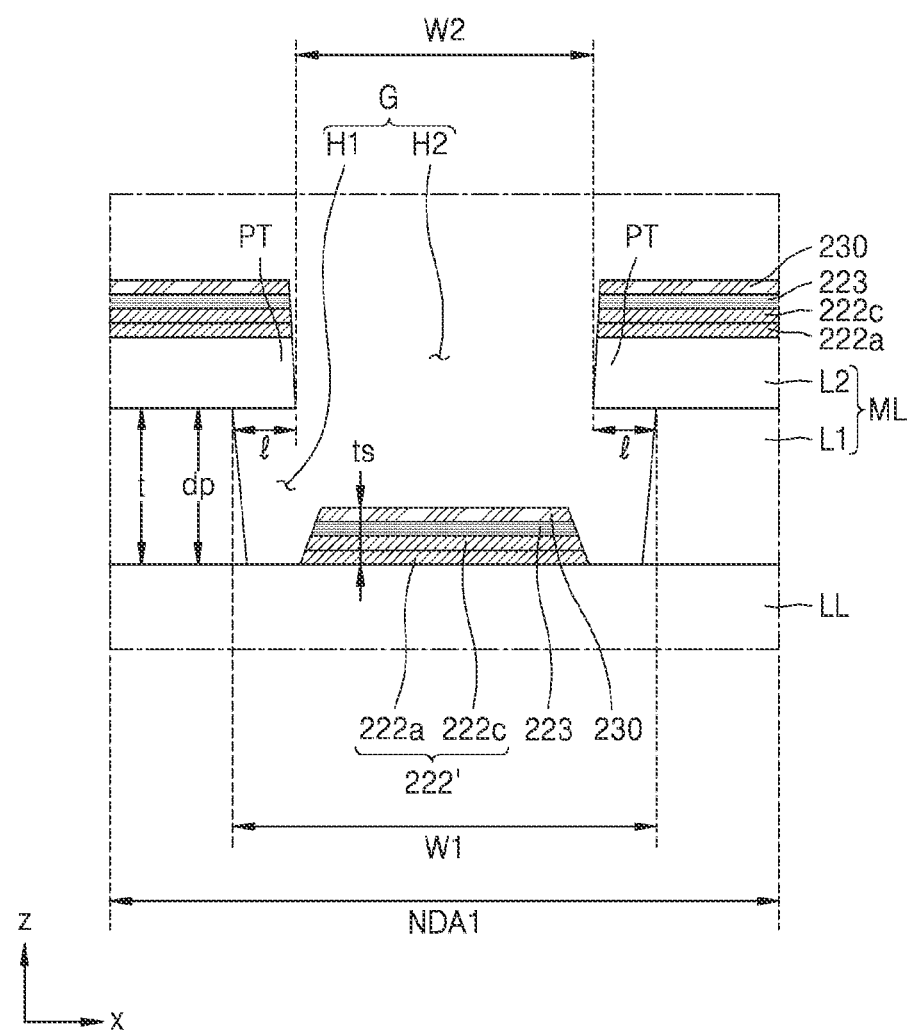

Referring to FIGS. 8A and 8B, a groove G is formed in a multi-layer ML. The multi-layer ML includes at least two layers respectively including different materials. In this regard, FIGS. 8A and 8B show the multi-layer ML including a first layer L1 including an organic material and a second layer L2 including an inorganic material. The first layer L1 may include an organic insulating material. For example, the first layer L1 may include a polymer resin such as polyimide. The second layer L2 may include an inorganic insulating material such as, for example, silicon nitride, silicon oxynitride, and/or silicon oxide. Alternatively, the second layer L2 may include a metal.

The multi-layer ML of FIGS. 8A and 8B may correspond to a portion of elements of the display panel 10 described with reference to FIG. 7. For example, the multi-layer ML may correspond to a portion of layers constituting the display panel 10, for example, layers disposed over the substrate 100.

The groove G may be formed in the multi-layer ML, and may have a depth in a depth direction of the multi-layer ML (e.g., in a z-direction). Referring to FIG. 8A, a second hole H2 that passes through the second layer L2 may be formed by etching the second layer L2, and a first recess R1 that is concave in a thickness direction (e.g., in the z-direction) of the first layer L1 may be formed by etching the first layer L1. The first recess R1 and the second hole H2 may be spatially connected to each other to constitute the groove G. Alternatively, as shown in FIG. 8B, the second hole H2 that passes through the second layer L2 may be formed by etching the second layer L2, and a first hole H1 that passes through the first layer L1 may be formed by etching the first layer L1. The first hole H1 and the second hole H2 may be spatially connected to constitute the groove G. The above-mentioned etching may include isotropic etching and/or anisotropic etching.

A width of a portion of the groove G that passes through the second layer L2 may be less than a width of a portion of the groove G that passes through the first layer L1. For example, a width W2 (or a diameter) of the second hole H2 may be less than a width W1 (or a diameter) of the first recess R1 or the first hole H1.

The groove G may have an undercut cross-section. A lateral side of the second layer L2 that defines the second hole H2 may protrude toward a center of the groove G further in a direction (e.g. an x-direction) parallel to a top surface (or a bottom surface) of the substrate 100 than a lateral side of the first layer L1 that defines the first recess R1 or the first hole H1. Portions of the second layer L2 that protrude toward the center of the groove G may constitute a pair of eaves that overhangs the lateral sides of the first layer L1 that define the first recess R1 or the first hole H1. The pair of eaves may also be referred to as a pair of protruding tips or tips PT.

The groove G may be formed before a process of forming the intermediate layer 222 described above with reference to FIG. 7. The capping layer 230 may include LiF. Similar to a sub-layer 222' and the opposite electrode 223, LiF may be formed by thermal evaporation. The sub-layer 222' of the intermediate layer 222, the opposite electrode 223, and the capping layer 230 may be disconnected by the groove G. In this regard, it is shown in FIGS. 8A and 8B that the first and second functional layers 222a and 222c, the opposite electrode 223, and the capping layer 230 are disconnected around the tips PT of the groove G. For example, as shown in FIGS. 8A and 8B, a first portion of each of the first and second functional layers 222a and 222c, the opposite electrode 223, and the capping layer 230 is disposed on top of the second layer L2, a second portion of each of the first and second functional layers 222a and 222c, the opposite electrode 223, and the capping layer 230 is disposed in the groove G, and these first and second portions are not connected to each other. Although it is shown in FIGS. 8A and 8B that the first and second functional layers 222a and 222c, the opposite electrode 223, and the capping layer 230 are disconnected around the groove G or the tips PT, the present disclosure is not limited thereto. For example, in an exemplary embodiment, one of the first and second functional layers 222a and 222c and/or the capping layer 230 may be omitted.

A length $\ell$ of each of the pair of tips PT may be less than about 2.0 μm and greater than about 0 μm. Here, the length $\ell$ of the tip PT may be measured in the horizontal direction (or a direction perpendicular to a top surface or a bottom surface of the substrate 100, e.g., the x-direction) toward the center of the groove G from a point at which a lateral surface and a top surface of the first layer L1 located directly under the second layer L2 including the tips PT meet each other in a cross-sectional view. For example, the length $\ell$ of the tip PT may be selected from a range greater than about 0 μm and less than about 2 μm. For example, in exemplary embodiments, the length $\ell$ of the tip PT may be about 0.3 μm≤ $\ell$ <about 2.0 μm, about 0.5 μm≤ $\ell$ <about 2.0 μm, about 0.8 μm≤ $\ell$ <about 2.0 μm, or about 1.0 μm≤ $\ell$ <about 2.0 μm. In the case in which the length € of the tip PT is less than about 0.3 μm, the sub-layer 222' and the opposite electrode 223 are not disconnected around the tips PT, and moisture may penetrate toward the organic light-emitting diode OLED of the display area DA through the sub-layer 222' that is not disconnected.

In the case in which the length € of the tip PT deviates from the above upper limit, a crack may occur in the tip PT, or the tip PT may be broken during a process of manufacturing the display panel 10 or after a manufacturing process. As an experimental example of the present disclosure, samples of the display panel 10 including tips of different lengths have been manufactured. Each of the samples was manufactured to have a tip having a length of about 0.8 inn to about 2.0 μm, and after the manufactured samples were left inside a chamber at a humidity of about 85% and a temperature of about 85° C. for a predetermined time (e.g. at least 240 hours), the tip PT was measured to determine whether the tip PT was damaged. As a result of the measurement, in the case in which the length $\ell$ of the tip PT was less than about 2.0 μm, the tip PT was not damaged. In contrast, in the case in which the length $\ell$ of the tip PT was greater than about 2.0 μm, damage to the tip PT began to occur. In the case in which the length $\ell$ of the tip PT was greater than about 2.0 μm, a damaged ratio of the tip PT (e.g., the number of damaged tips PT/the number of all tips PT) was about 46.7%.

The groove G may have a predetermined depth dp. Here, the depth dp of the groove G denotes a depth of a portion of the groove G that passes through the first layer L1. For example, the depth dp of the groove G corresponds to a vertical distance from a top surface of the first layer L1 directly under the tip PT to a bottom surface of the groove G.

The depth dp of the groove G may be greater than the length $\ell$ of the tip PT. In an exemplary embodiment, the depth dp of the groove G and the length $\ell$ of the tip PT may be about 0.05<($\ell$/dp)<about 0.50, about 0.1<($\ell$/dp)<about 0.50, about 0.15<($\ell$/dp)<about 0.50, about 0.2<($\ell$/dp)<about 0.50, about 0.25<($\ell$/dp)<about 0.50, about 0.25<($\ell$/dp)<about 0.45, about 0.25<($\ell$/dp)<about 0.40, or about 0.25<($\ell$/dp)<about 0.35.

The depth dp of the groove G may be greater than a sum is of a thickness of the first and second functional layers 222a and/or 222c, a thickness of the opposite electrode 223, and a thickness of the capping layer 230 that are disconnected around the groove G. Alternatively, the depth dp of the groove G may be about 3.0 μm or more.

Referring to FIG. 8A, the depth dp of the groove G may be less than a thickness t of the first layer L1, and a bottom surface of the groove G may be located between a top surface and a bottom surface of the first layer L1. Alternatively, as shown in FIG. 8B, the depth dp of the groove G may be the same as the thickness t of the first layer L1. Therefore, the bottom surface of the groove G may be located on the bottom surface of the first layer L1 or a top surface of a lower layer LL disposed under the first layer L1. The lower layer LL may include an insulating material such as, for example, an organic or inorganic insulating material. In an exemplary embodiment, the depth dp may be equal to or less than about 6.0 The depth dp of the groove G may be about 2.0 μm≤dp≤about 6.0 about 2.5 μm≤dp≤about 6.0 μm about 3.0 μm≤dp≤about 6.0 μm, 3.5 μm≤dp≤about 6.0 μm about 4.0 μm≤dp≤about 6.0 μm about 4.5 μm≤dp≤about 6.0 μm, about 5.0 μm≤dp≤about 6.0 μm, or about 5.5 μm≤dp≤about 6.0 μm.

A distance between the pair of tips PT, that is, the second width W2, may be greater than the length $\ell$ of the tip PT. In an exemplary embodiment, the second width W2 may be in a range from about three times to about one hundred times the length $\ell$ of the tip PT, a range from about five times to about seventy times the length $\ell$ of the tip PT, a range from about five times to about fifty times the length $\ell$ of the tip PT, a range from about five times to about thirty times the length $\ell$ of the tip PT, a range from about five times to about twenty times the length $\ell$ of the tip PT, or a range from about seven times to about twenty times the length $\ell$ of the tip PT. The second width W2 may be greater than the depth dp of the groove G. For example, the second width W2 may be about 1.5 times or more of the depth dp of the groove G, about 2 times or more of the depth dp of the groove G, or about 2.5 times or more of the depth dp of the groove G.

Figure 8C:
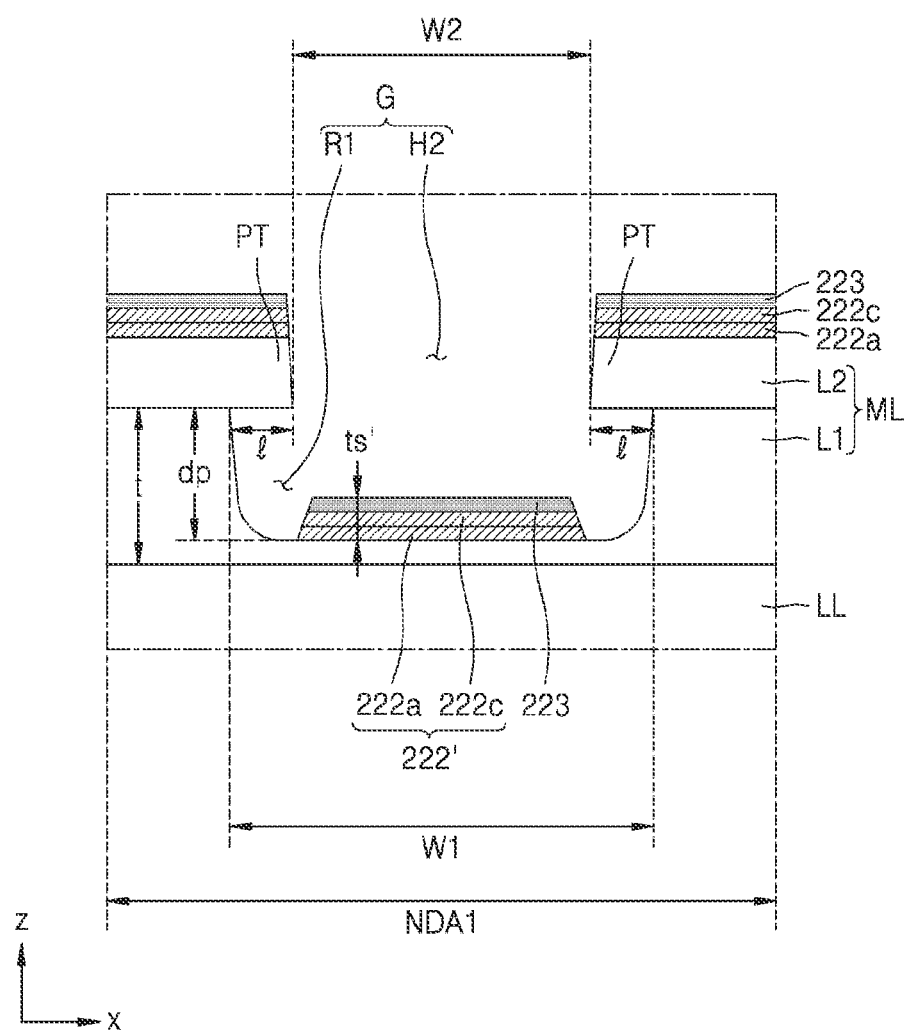

Although FIGS. 8A and 8B illustrate that the first and second functional layers 222a and 222c, the opposite electrode 223, and the capping layer 230 are disconnected around the groove G or the tip PT, the present disclosure is not limited thereto. For example, in an exemplary embodiment, as shown in FIG. 8C, the capping layer 230 may be omitted. In this case, layers that are disconnected by the groove G may include the first and second functional layers 222a and 222c and the opposite electrode 223. For example, as shown in FIG. 8C, a first portion of each of the first and second functional layers 222a and 222c and the opposite electrode 223 is disposed on top of the second layer L2, a second portion of each of the first and second functional layers 222a and 222c and the opposite electrode 223 is disposed in the groove G, and these first and second portions are not connected to each other. In an exemplary embodiment, one of the first and second functional layers 222a and 222c may be omitted. As described above, the depth dp of the groove G is greater than a thickness ts' of the stacked body including the first and second functional layers 222a and 222c and the opposite electrode 223, as shown in FIG. 8C. Also, in an exemplary embodiment according to FIG.

8C, features of the length ℓ of the tip PT and the depth dp of the groove G are the same as those described with reference to FIGS. 8A and 8B. The structure in which the capping layer 230 has been omitted, described with reference to FIG. 8C, is applicable to the exemplary embodiment described with reference to FIG. 8B.

Figure 8D:
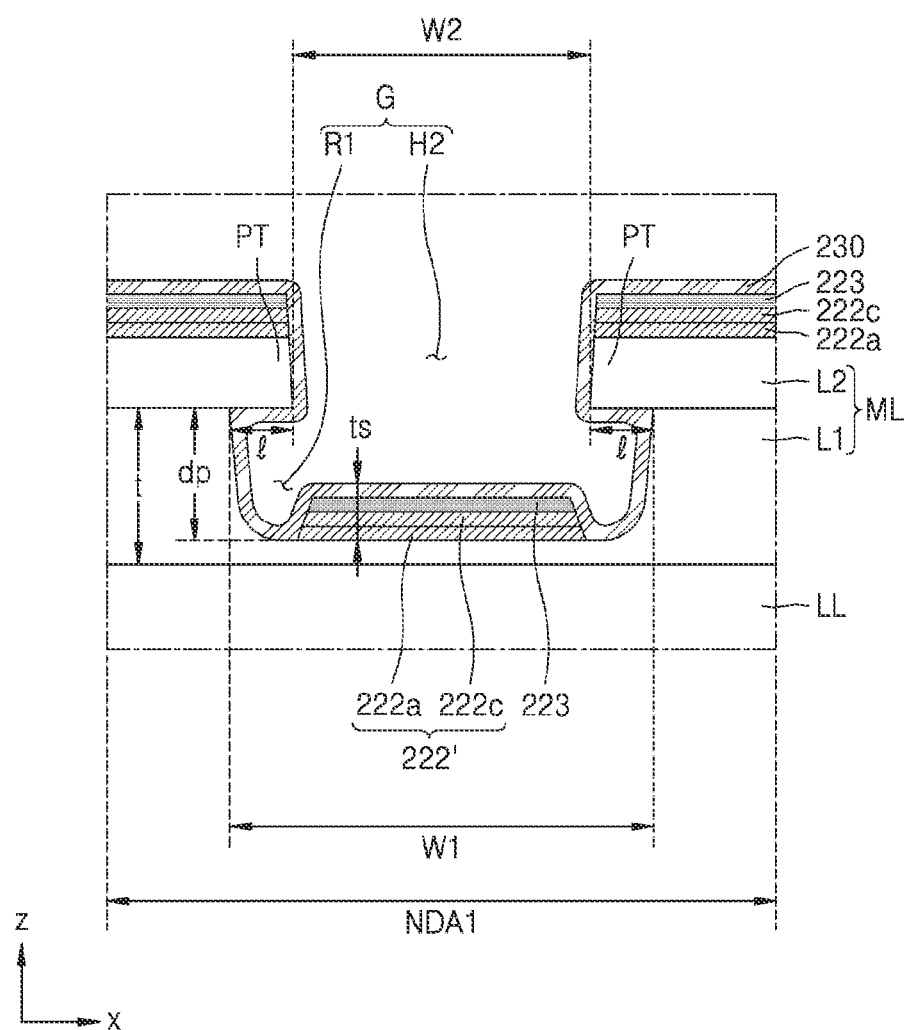

In an exemplary embodiment, as shown in FIG. 8D, the capping layer 230 is not disconnected around the groove G. For example, the capping layer 230 is disposed on the upper surface and the lateral surface of the second layer L2, and extends into the groove G without any breaks or holes. The capping layer 230 may include an inorganic insulating material such as, for example, silicon oxide, silicon nitride, or silicon oxynitride, and the inorganic insulating material may be formed by chemical vapor deposition (CVD). Since the capping layer, which includes an inorganic insulating material, has a relatively excellent step coverage compared to the first and second functional layers 222a and 222c and the opposite electrode 223 that are formed by thermal evaporation, as shown in FIG. 8D, the capping layer 230 may entirely and continuously cover an inner surface of the groove G. For example, the capping layer 230 may cover the inner surface of the groove G in a continuous matter without any breaks or holes. Other features of the capping layer 230 except the feature that the capping layer 230 continuously covers the inner surface of the groove G are the same as those described with reference to FIGS. 8A and 8B.

In an exemplary embodiment, in the case in which the capping layer 230 includes an organic material, the capping layer 230 may be disconnected around the groove G as described with reference to FIGS. 8A and 8B.

Figure 9:
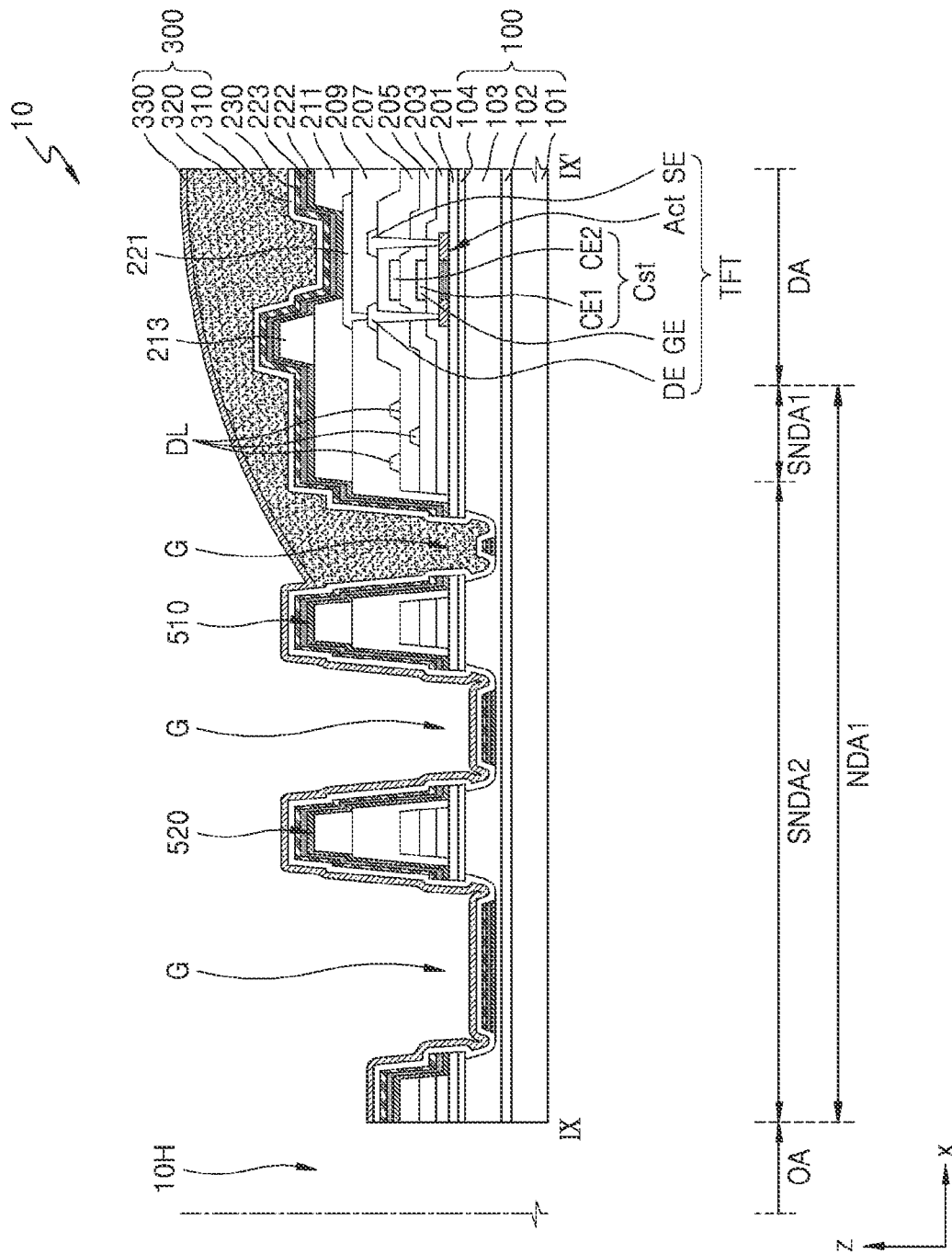
FIG. 9 is a cross-sectional view of a display panel according to an exemplary embodiment.
Figure 10:
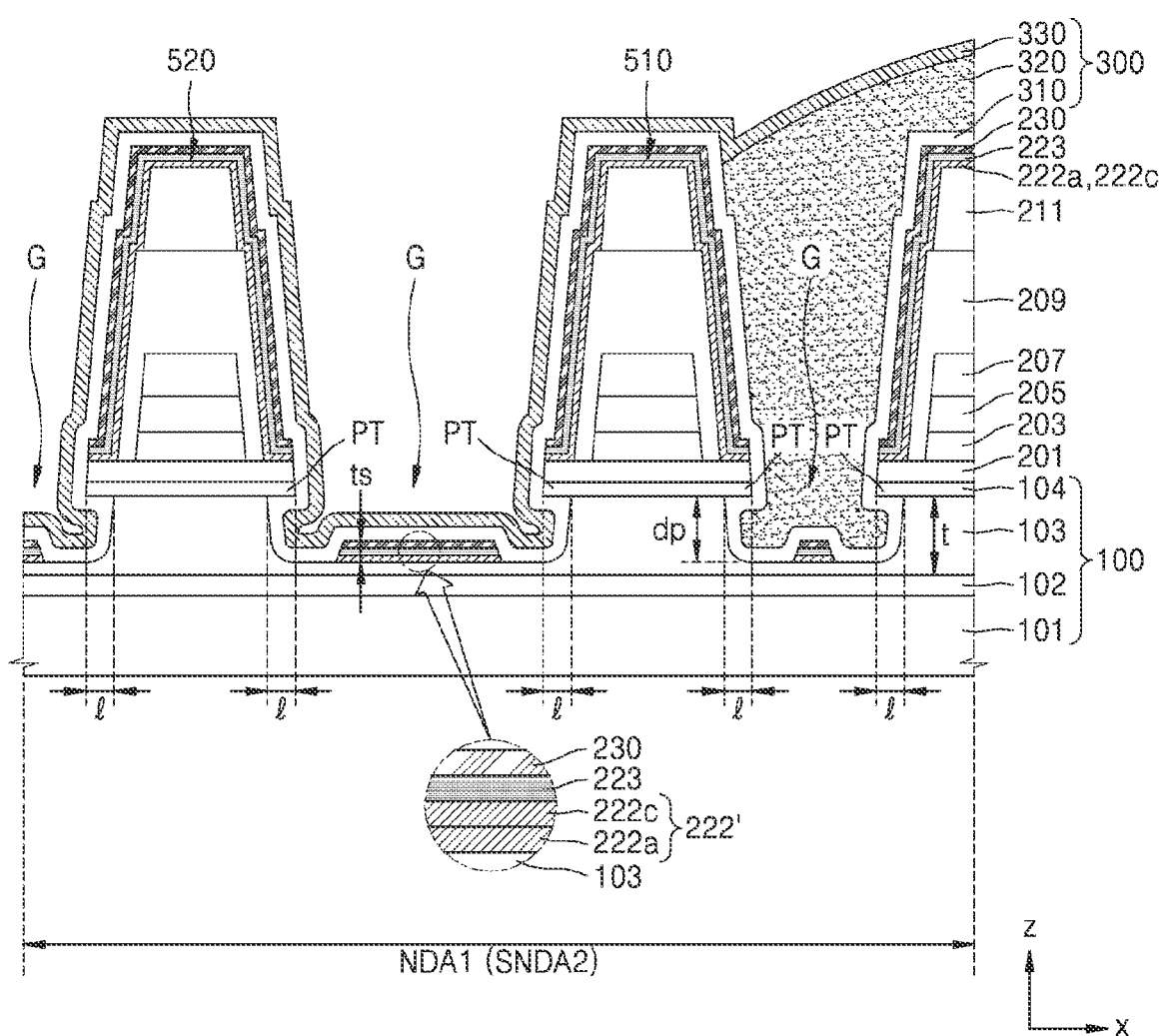
FIG. 10 is a cross-sectional view of a groove of a display panel according to an exemplary embodiment.
Figure 11:
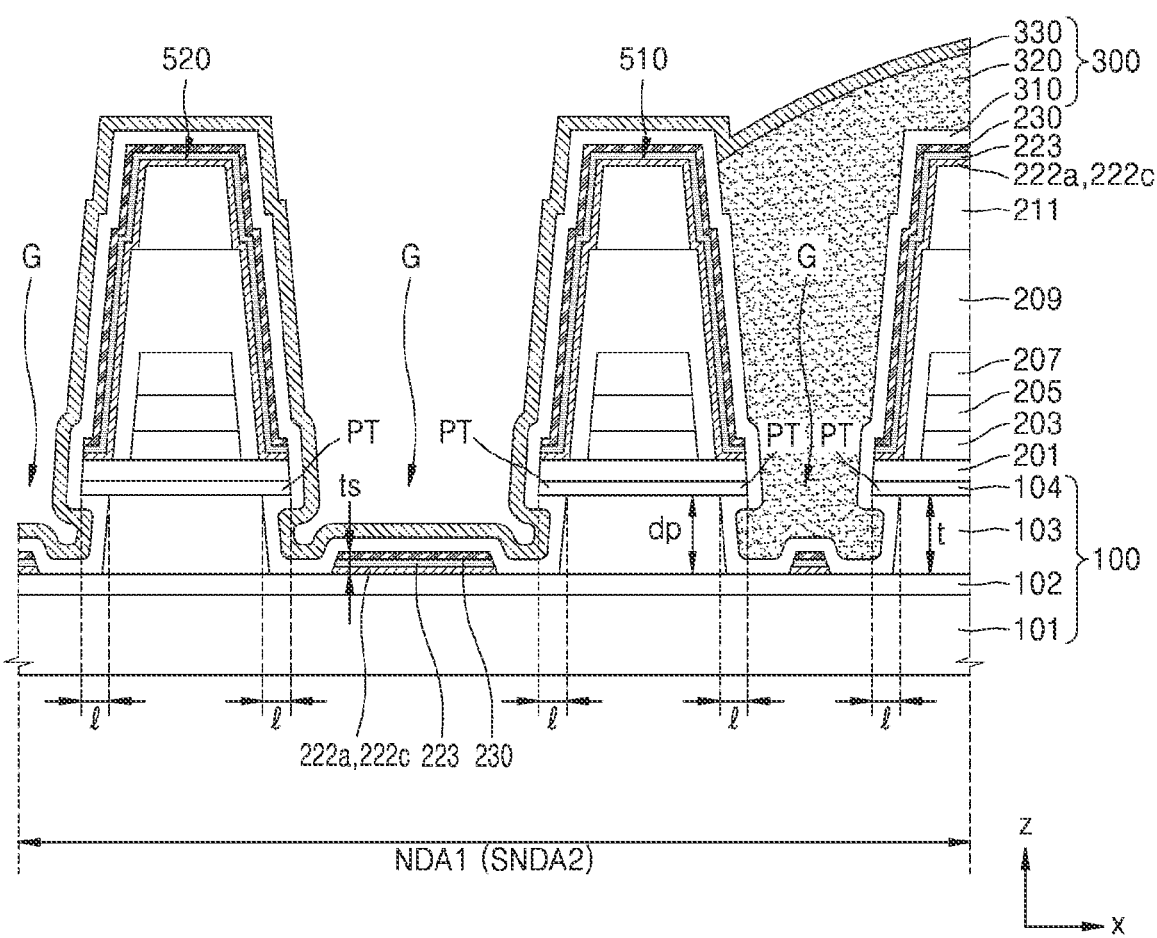
FIG. 11 is a cross-sectional view of a groove of a display panel according to an exemplary embodiment.

FIG. 9 is a cross-sectional view of the display panel 10 according to an exemplary embodiment. FIG. 10 is a cross-sectional view of a groove G of the display panel 10 according to an exemplary embodiment. FIG. 11 is a cross-sectional view of a groove G of the display panel 10 according to an exemplary embodiment. FIG. 9 may correspond to a cross-section taken along line IX-IX' of FIG. 6, and FIG. 10 may correspond to an enlarged cross-section of the groove G of FIG. 9.

Referring to FIG. 9, the display panel 10 includes the opening area OA, the display area DA, and the first non-display area NDA1. The display panel 10 may include the first opening 10H corresponding to the opening area OA. For example, the first opening 10H may be aligned with the opening area OA.

Referring to the display area DA of FIG. 9, a thin film transistor TFT and a storage capacitor Cst are arranged over the substrate 100 in the display area DA.

The substrate 100 may include a multi-layer. For example, the substrate 100 may include a first base layer 101, a first barrier layer 102, a second base layer 103, and a second barrier layer 104 that are sequentially stacked.

Each of the first and second base layers 101 and 103 may include a polymer resin. For example, each of the first and second base layers 101 and 103 may include a polymer resin such as polyethersulfone (PES), polyarylate, polyetherimide (PEI), polyethylene naphthalate (PEN), polyethylene terephthalate (PET), polyphenylene sulfide (PPS), polyimide (PI), polycarbonate (PC), cellulose triacetate (TAC), or cellulose acetate propionate (CAP). The polymer resin may be transparent.

Each of the first and second barrier layers 102 and 104 may include a barrier layer configured to prevent penetration of external foreign substances, and may include a single layer or a multi-layer including an inorganic material such as silicon nitride and/or silicon oxide.

The insulating layers 201, 203, 205, 207 and 209 may be arranged between the semiconductor layer of the thin film transistor TFT and between the electrodes of the storage capacitor Cst. The pixel electrode 221 electrically connected to the thin film transistor TFT, the intermediate layer 222, the opposite electrode 223, and the capping layer 230 may be arranged in the display area DA, and the above-described configurations are the same as those described above with reference to FIG. 7.

The display elements including the pixel electrode 221, the intermediate layer 222, and the opposite electrode 223 are covered by a thin-film encapsulation layer 300. The thin-film encapsulation layer 300 may include at least one organic encapsulation layer and at least one inorganic encapsulation layer. It is shown in FIG. 9 that the thin-film encapsulation layer 300 includes first and second inorganic encapsulation layers 310 and 330 and an organic encapsulation layer disposed 320 therebetween. However, the present disclosure is not limited thereto. For example, in an exemplary embodiment, the number of organic encapsulation layers, the number of inorganic encapsulation layers, and a stacking sequence thereof may change.

The first inorganic encapsulation layer 310 may include at least one inorganic insulating material such as, for example, aluminum oxide, titanium oxide, tantalum oxide, hafnium oxide, zinc oxide, silicon oxide, silicon nitride, and silicon oxynitride. The first inorganic encapsulation layer 310 may be formed by CVD. The organic encapsulation layer 320 may include a polymer-based material. The polymer-based material may include an acrylic-based resin, an epoxy-based resin, polyimide, and polyethylene.

Referring to the first non-display area NDA1 of FIG. 9, the first non-display area NDA1 may include a first sub non-display area SNDA1 that neighbors the display area DA, and a second sub non-display area SNDA2 that neighbors the opening area OA or the first opening 10H.

The first sub non-display area SNDA1 may be an area across which signal lines, for example, the data lines DL described with reference to FIG. 5, pass. The data lines DL shown in FIG. 9 may correspond to data lines that detour/bypass around the opening area OA. The first sub non-display area SNDA1 may be a wiring area or a detour/bypass region across which the data lines DL pass.

The data lines DL may be alternately arranged with an insulating layer disposed therebetween, as shown in FIG. 9. For example, in an exemplary embodiment, the data lines DL may be alternately arranged on different insulating layers. Alternatively, the data lines DL may be arranged on the same layer. In the case in which neighboring data lines DL are respectively arranged above and below an insulating layer (e.g. the second interlayer insulating layer 207) while the insulating layer (e.g. the second interlayer insulating layer 207) is interposed between the neighboring data lines DL, a gap (pitch) between the neighboring data lines DL may be reduced, and a width of the first non-display area NDA1 may be reduced. Although it is shown in FIG. 9 that the data lines DL are located in the first sub non-display area SNDA1, the scan lines that detour/bypass the opening area OA described above with reference to FIG. 5 may also be located in the first sub non-display area SNDA1.

The second sub non-display area SNDA2 is a groove area in which the grooves G are arranged. FIG. 9 shows three grooves G located in the second sub non-display area SNDA2. The grooves G may be formed in the multi-layer including the first and second layers respectively including different materials, as described above with reference to FIGS. 8A and 8B. In an exemplary embodiment, the groove G is formed in a sub-layer provided to the substrate 100, as shown in FIG. 9.

Referring to the second sub non-display area SNDA2 of FIGS. 9 and 10, the groove G may be formed by removing a portion of the second barrier layer 104 and a portion of the second base layer 103. For example, a hole that passes through the second barrier layer 104 and the buffer layer 201, and a recess formed in the second base layer 103, may be spatially connected to each other to constitute the groove G. The second base layer 103 may correspond to the first layer L1 of the multi-layer ML described above with reference to FIGS. 8A and 8B, and the second barrier layer 104 may correspond to the second layer L2 of the multi-layer ML.

As described above, during a process of forming the groove G, the buffer layer 201 disposed on the second barrier layer 104 may be simultaneously removed with the second barrier layer 104 to constitute the groove G. Although the buffer layer 201 and the second barrier layer 104 are described as separate elements, in an exemplary embodiment, the buffer layer 201 of the substrate 100 may be a sub-layer of the second barrier layer 104 having a multi-layered structure.

The tip PT of the groove G has a predetermined length ℓ, and a feature of the length ℓ of the tip PT is the same as that described above with reference to FIGS. 8A and 8B. For example, the length ℓ of the tip PT may be less than about 2.0 μm.

As shown in FIG. 10, the depth dp of the groove G may be less than a thickness t of the second base layer 103. Alternatively, as shown in FIG. 11, the depth dp of the groove G may be about the same as the thickness t of the second base layer 103, and a feature of the depth dp is the same as that described above with reference to FIGS. 8A and 8B.

As described above, the first and second functional layers 222a and 222c that correspond to the sub-layer 222' of the intermediate layer 222, the opposite electrode 223 and/or the capping layer 230 may be disconnected by the grooves G in the second sub non-display area SNDA2.

The first inorganic encapsulation layer 310 of the thin-film encapsulation layer 300 has a relatively excellent step coverage compared to the sub-layer 222' of the intermediate layer 222, the opposite electrode 223 and/or the capping layer 230. Therefore, the first inorganic encapsulation layer 310 may be continuously formed without disconnection around the groove G. For example, the first inorganic encapsulation layer 310 may extend continuously around the groove G without any breaks or holes.

As shown in FIG. 9, the first inorganic encapsulation layer 310 may entirely cover the display area DA and the first non-display area NDA1. In the first non-display area NDA1, the first inorganic encapsulation layer 310 may entirely and continuously cover the inner surfaces of the grooves G. Stacks of the first and second functional layers 222a and 222c, the opposite electrode 223 and the capping layer 230 disconnected around the tip PT are arranged on a bottom surface of the groove G. The first inorganic encapsulation layer 310 may contact a layer under the second base layer 103, for example, the first barrier layer 102, while covering the stacks.

The organic encapsulation layer 320 may be formed by coating a monomer and hardening the monomer. A flow of the monomer may be controlled by a partition wall, for example, first and second partition walls 510 and 520. In this regard, it is shown in FIGS. 9 to 11 that an end of the organic encapsulation layer 320 is located on one side of the first partition wall 510. The organic encapsulation layer 320 may at least partially fill one of the grooves G. For example, a space of the groove G over the first inorganic encapsulation layer 310 that is located between the display area DA and the first partition wall 510 may be at least partially filled with material of the organic encapsulation layer 320.

Similar to the first inorganic encapsulation layer 310, the second inorganic encapsulation layer 330 may entirely and continuously cover the inner surface of the groove G. A portion of the second inorganic encapsulation layer 330 may directly contact the first inorganic encapsulation layer 310 in the second sub non-display area SNDA2. The second inorganic encapsulation layer 330 may directly contact the first inorganic encapsulation layer 310 on at least one of the plurality of grooves G. The first and second inorganic encapsulation layers 310 and 330 may also contact each other on top surfaces of the first and second partition walls 510 and 520.

Figure 12:
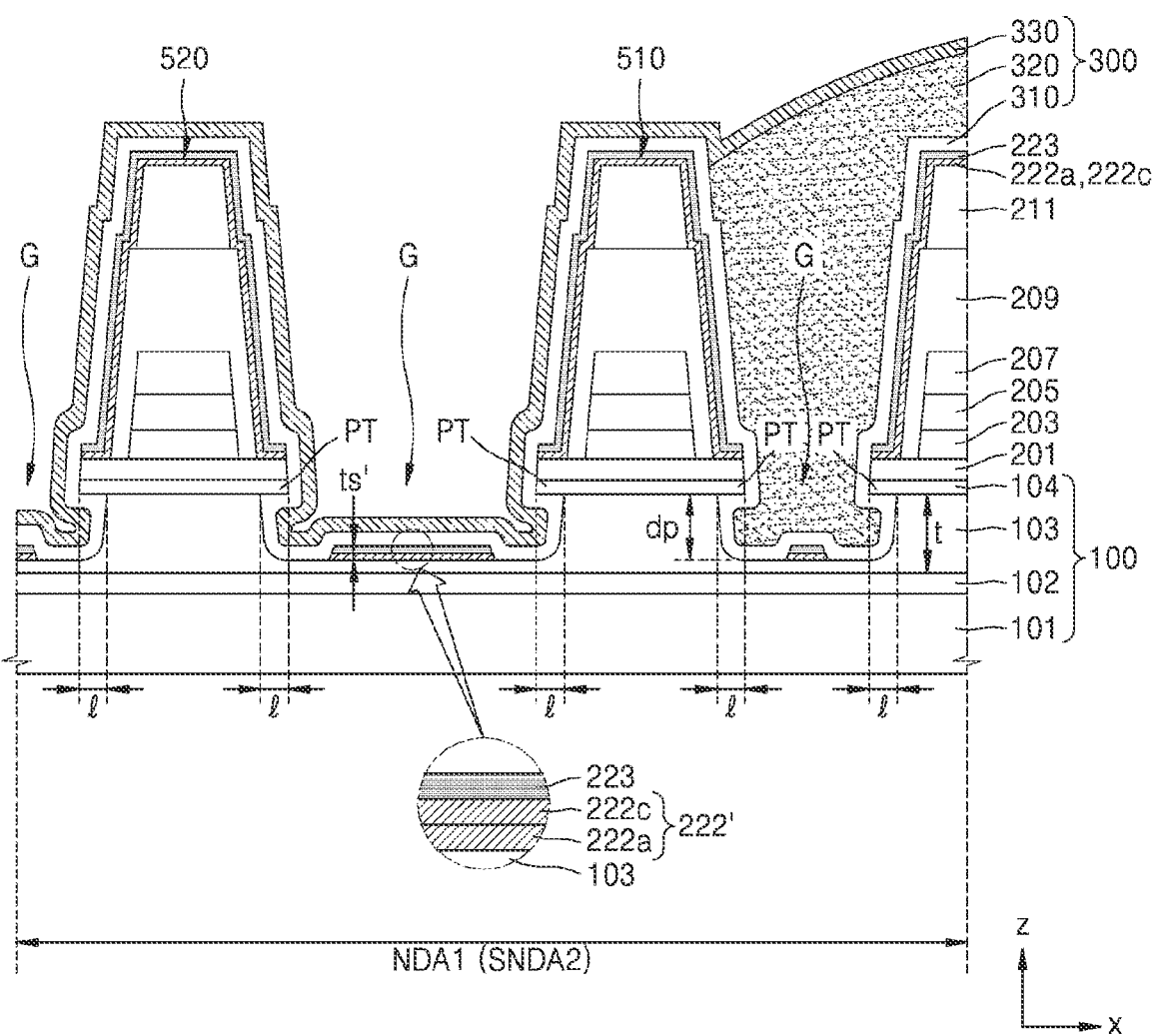
FIG. 12 is a cross-sectional view of a groove of a display panel according to an exemplary embodiment.

FIG. 12 is a cross-sectional view of a groove of a display panel according to an exemplary embodiment.

Referring to FIG. 12, unlike the display panel 10 described above with reference to FIG. 10, the capping layer 230 may be omitted. Features except that the capping layer 230 is omitted are the same as those described above with reference to FIG. 10. For example, a feature regarding the length ℓ of the tip PT of the groove G is the same as that described above with reference to FIGS. 8A to 8C. For example, the length ℓ of the tip PT may be less than about 2.0 μm. Also, as shown in FIG. 10, the depth dp of the groove G may be less than a thickness t of the second base layer 103. Alternatively, as shown in FIG. 11, the depth dp of the groove G may be about the same as the thickness t of the second base layer 103, and a feature regarding the depth dp is the same as that described above with reference to FIGS. 8A to 8C. The structure in which the capping layer 230 has been omitted, described with reference to FIG. 12, is applicable to exemplary embodiments which will be described with reference to FIGS. 14 to 17, and exemplary embodiments derived therefrom.

The capping layer 230 described with reference to FIGS. 9 to 11 may include a material having a relatively low step coverage such as, for example, LiF. Therefore, although FIGS. 9 to 11 show a structure disconnected around the groove G, the present disclosure is not limited thereto.

Figure 13:
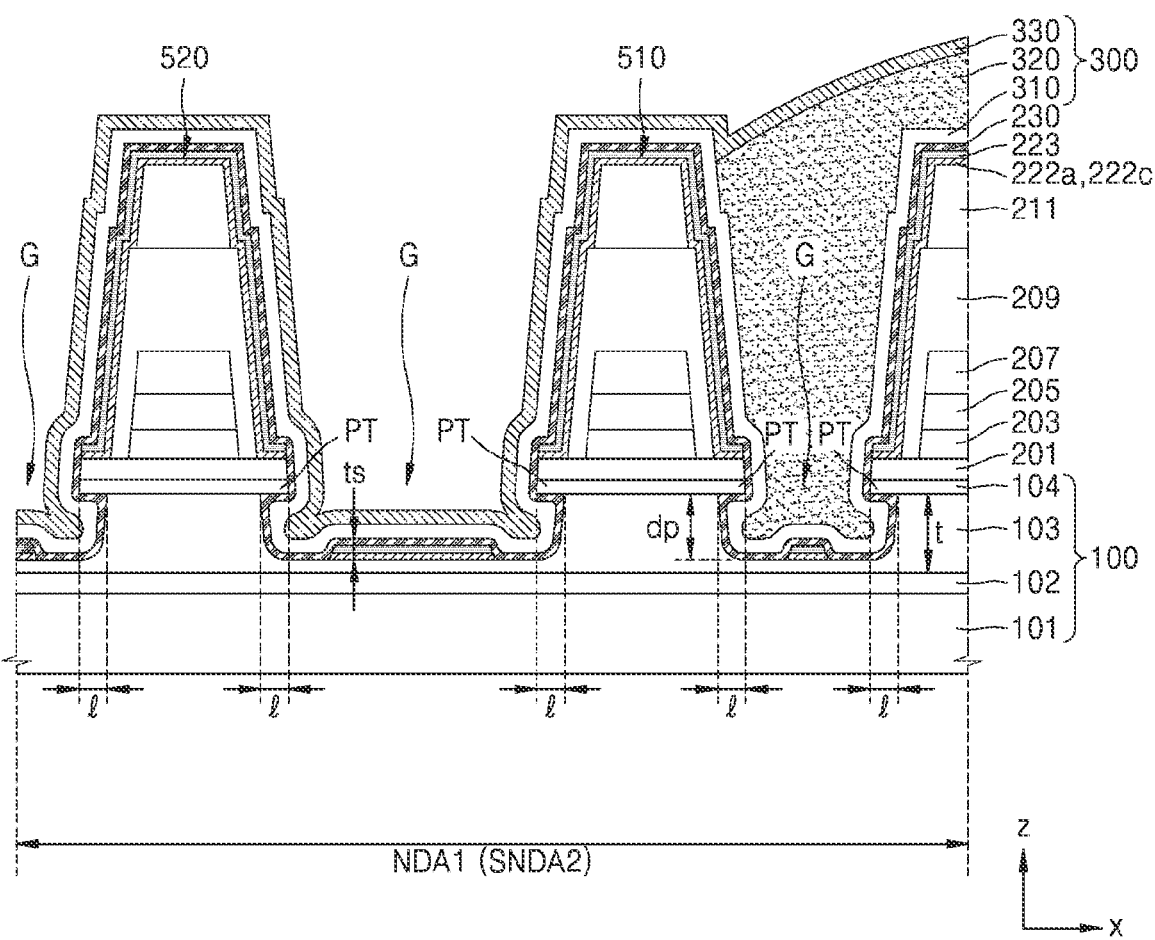
FIG. 13 is a cross-sectional view of a groove of a display panel according to an exemplary embodiment.

FIG. 13 is a cross-sectional view of a groove G of the display panel 10 according to an exemplary embodiment.

Referring to FIG. 13, the capping layer 230 may include an inorganic insulating material. Since the capping layer 230 including an inorganic insulating material formed through a process such as CVD has a relatively excellent step coverage, the capping layer 230 is not disconnected around the groove G and may continuously cover an inner surface of the groove G.

The capping layer 230 may include an inorganic material such as, for example, silicon nitride, silicon oxide, or silicon oxynitride. The first inorganic encapsulation layer 310 may be arranged on the capping layer 230. The first inorganic encapsulation layer 310 may include the inorganic insulating material. In an exemplary embodiment, the capping layer 230 including the inorganic insulating material may be a sub-layer of the first inorganic encapsulation layer 310. In an exemplary embodiment, one sub-layer of the first inorganic encapsulation layer 310 that includes at least two silicon oxynitride layers or at least two silicon nitride layers having different characteristics/qualities may be the capping layer 230.

The structure of the capping layer 230 described with reference to FIG. 13 is applicable to exemplary embodiments described with reference to FIGS. 14 to 17 and exemplary embodiments derived therefrom.

Figure 14:
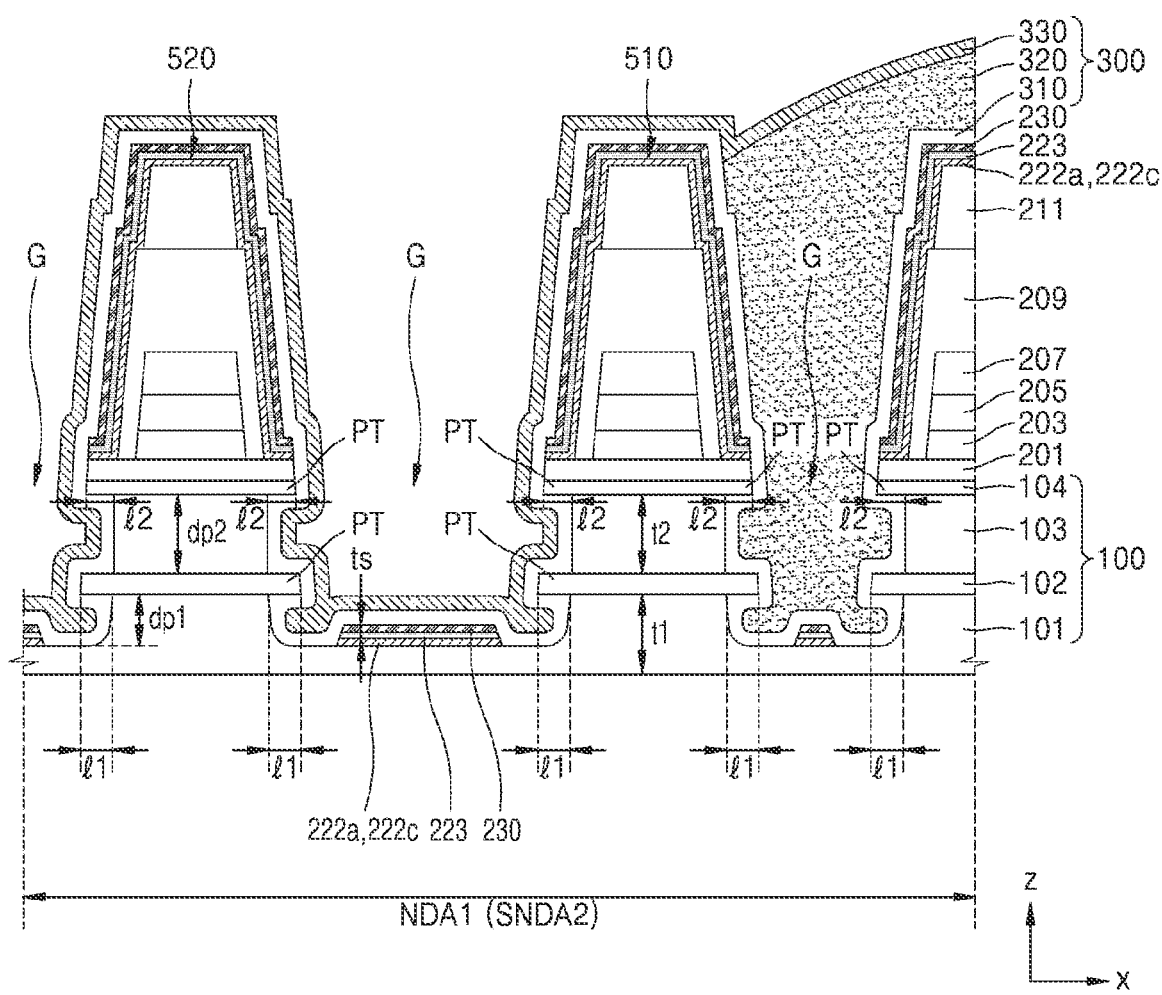
FIG. 14 is a cross-sectional view of a groove of a display panel according to an exemplary embodiment.

FIG. 14 is a cross-sectional view of a groove G of the display panel 10 according to an exemplary embodiment.

Referring to FIG. 14, the groove G may have a plurality of undercut cross-sections that overlap in a depth direction (or a thickness direction of the substrate 100). For example, the first base layer 101 and the first barrier layer 102 may have an undercut cross-section (referred to as a first undercut cross-section), and the second base layer 103 and the second barrier layer 104 may have an undercut cross-section (referred to as a second undercut cross-section). The groove G may have a structure in which the first and second undercut cross-sections overlap each other.

Tips PT of the first barrier layer 102 and the second barrier layer 104 respectively have a first length $\ell 1$ and a second length $\ell 2$. Features of the first length $\ell 1$ and the second length $\ell 2$ are the same as features of the length $\ell$ described above with reference to FIGS. 8A and 8B. For example, each of the first and second lengths $\ell 1$ and $\ell 2$ may be less than about 2.0 μm.

Each of the first base layer 101 and the second base layer 103 has a first depth dp1 and a second depth dp2. The second depth dp2 of the second base layer 103 may be the same as a thickness t2 of the second base layer 103, and the first depth dp1 of the first base layer 101 may be less than a thickness t1 of the first base layer 101. When the above features are met, features of the depth dp described above with reference to FIGS. 8A and 8B are equally applicable to the first depth dp1 and the second depth dp2 shown in FIG. 14. The first and second depths dp1 and dp2 may be greater than the lengths $\ell$ of the tip PT. For example, the first and second depths dp1 and dp2 may be respectively greater than the corresponding first and second lengths $\ell 1$ and $\ell 2$ of the tip PT. The first depth dp1 may be greater than a sum is of thicknesses of the first and second functional layers 222a and 222c, the opposite electrode 223, and the capping layer 230 that are disconnected around the groove G. In an exemplary embodiment, the first depth dp1 may be about 2.0 μm or more, or about 3.0 μm or more.

Although it is shown in FIGS. 9 to 14 that the multi-layer including the groove G is formed in sub-layers of the substrate 100, the present disclosure is not limited thereto. As described below with reference to FIGS. 15 and 16, the groove G may be located over the substrate 100 according to exemplary embodiments.

Figure 15:
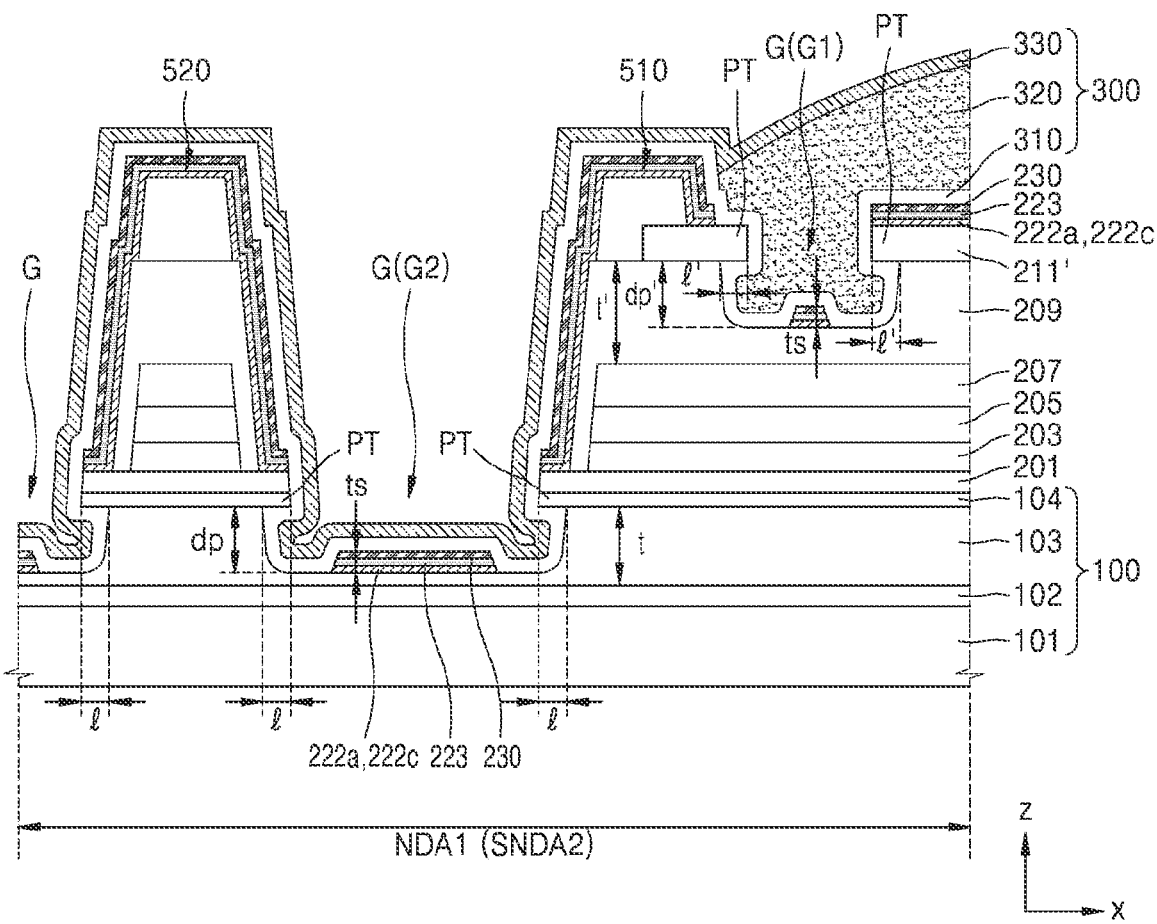
FIG. 15 is a cross-sectional view of grooves arranged in a first non-display area of a display panel according to an exemplary embodiment.

FIG. 15 is a cross-sectional view of grooves G arranged in the first non-display area NDA1 of the display panel 10 according to an exemplary embodiment.

Referring to FIG. 15, one groove G (referred to as a first groove G1) of the plurality of grooves G may be located over the substrate 100, and another groove G (referred to as a second groove G2) may be formed by removing some of sub-layers of the substrate 100. Since features of the second groove G2 are the same as those described with reference to FIGS. 8A to 11, the first groove G1 is mainly described below.

For example, the first groove G1 may be formed by removing a first insulating layer 209 and a second insulating layer 21F disposed on the first insulating layer 209. The first insulating layer 209 may correspond to the first layer L1 of the multi-layer ML described above with reference to FIGS. 8A and 8B, and the second insulating layer 21F may correspond to the second layer L2 of the multi-layer ML. The first insulating layer 209 may include an organic material such as, for example, polyimide, and the second insulating layer 211' may include an inorganic material such as, for example, silicon nitride, silicon oxynitride, and/or silicon oxide.

The first groove G1 may have an undercut cross-section. For example, as shown in FIG. 15, a hole of the second insulating layer 211' and a recess of the first insulating layer 209 may constitute the first groove G1. In an exemplary embodiment, a hole of the second insulating layer 211' and a hole of the first insulating layer 209 may constitute the first groove G1.

A feature of a length $\ell$ of a tip PT provided to the second insulating layer 211' is the same as the feature of the length $\ell$ described above with reference to FIGS. 8A and 8B. For example, the length $\ell$ of the tip PT may be less than about 2.0 μm.

A feature of a depth dp' of the first groove G1, that is, a depth of the recess or the hole of the first insulating layer 209, is the same as the feature of the depth described above with reference to FIGS. 8A and 8B. For example, the depth dp' of the first groove G1 may be greater than the length $\ell$' of the tip PT. The depth dp' of the first groove G1 may be about equal to or less than a thickness t' of the first insulating layer 209 and may be, for example, about 2.0 μm or more, or about 3.0 μm or more.

Here, the thickness of the first insulating layer 209 is a vertical distance between a top surface and a bottom surface of the first insulating layer 209 in an area in which the first groove G1 is arranged. In FIG. 15, a top surface of a second interlayer insulating layer 207 may be the bottom surface of the first insulating layer 209.

The first and second functional layers 222a and 222c, the opposite electrode 223, and the capping layer 230 may be disconnected around the first and second grooves G1 and G2, and the respective depths dp' and dp of the first and second grooves G1 and G2 may be greater than the thickness is of the stacks of the first and second functional layers 222a and 222c, the opposite electrode 223, and the capping layer 230, as described with reference to FIGS. 8A and 8B.

Respective inner surfaces of the first and second grooves G1 and G2 may be continuously covered by the first inorganic encapsulation layer 310. A space of the first groove G1 that is disposed over the first inorganic encapsulation layer 310 may be at least partially filled with the organic encapsulation layer 320. A partition wall 510 may be located between the first and second grooves G1 and G2, and an end of the organic encapsulation layer 320 may be located on one side of the partition wall 510.

Although it is shown in FIG. 15 that the second groove G2 has the same structure as that of the groove G shown in FIG. 10, the present disclosure is not limited thereto. For example, in an exemplary embodiment, the second groove G2 may have the same structure as that of the groove G described with reference to FIGS. 11 to 14.

The feature described with reference to FIG. 15, for example, the feature that the grooves G of the first non-display area NDA1, for example, the first and second grooves G1 and G2, are formed in a different multi-layer, is applicable to other exemplary embodiments. For example, the above feature is applicable to the exemplary embodiments described above with reference to FIGS. 10 to 14 and exemplary embodiments described below with reference to FIG. 16 and/or exemplary embodiments derived therefrom.

Figure 16:
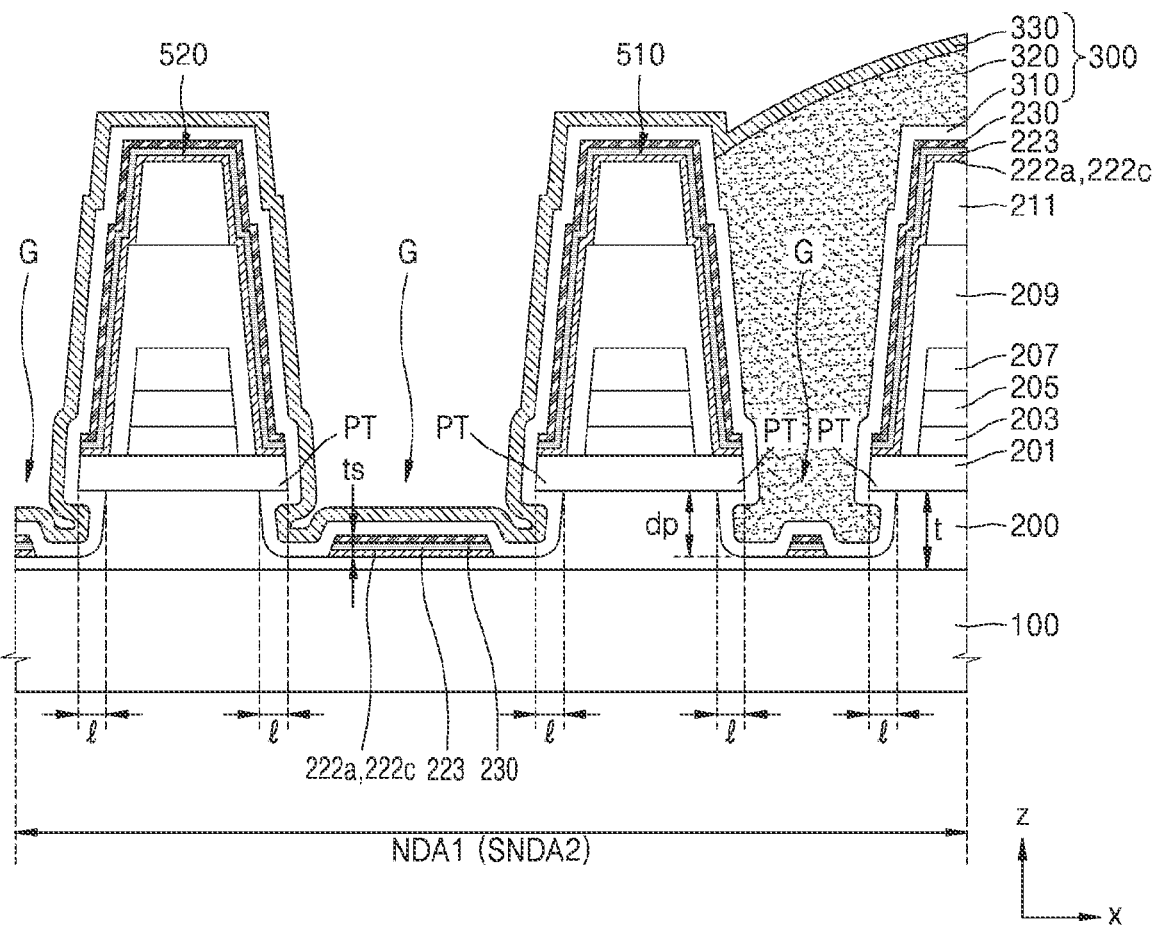
FIG. 16 is a cross-sectional view of grooves arranged in a first non-display area of a display panel according to an exemplary embodiment.

FIG. 16 is a cross-sectional view of grooves G arranged in the first non-display area NDA1 of the display panel 10 according to an exemplary embodiment.

Referring to FIG. 16, one or more grooves G may be formed in a multi-layer, for example, multi-layers including an insulating layer 200 and a buffer layer 201 located on the substrate 100. The insulating layer 200 may include a material different from that of the buffer layer 201 such as, for example, an organic material such as polyimide. The buffer layer 201 may include an inorganic material as described with reference to FIG. 7. The insulating layer 200 may be provided in not only the first non-display area NDA1, but also in the display area DA, as shown in FIG. 16, and may be located between the substrate 100 and the buffer layer 201.

The groove G may have an undercut cross-section. A hole of the buffer layer 201 and a recess or a hole of the insulating layer 200 may be spatially connected to each other to constitute the groove G. A length ℓ of a tip PT of the buffer layer 201 that extends toward a center of the groove G is the same as that described above with reference to FIGS. 8A and 8B. For example, the length ℓ of the tip PT may be less than about 2.0 μm. A depth dp of the groove G may be about equal to or less than a thickness t of the insulating layer 200. Since other features of the depth dp are the same as those described with reference to FIGS. 8A and 8B, a repeated description thereof is omitted.

Since the grooves G are formed in the multi-layers including the insulating layer 200 and the buffer layer 201 arranged on the substrate 100, the substrate 100 may include various kinds of materials. For example, the substrate 100 may include an inorganic material or an organic material, or may include both the inorganic material and the organic material. For example, the substrate 100 may include various kinds of materials such as glass, metal, and/or a resin.

Figure 17:
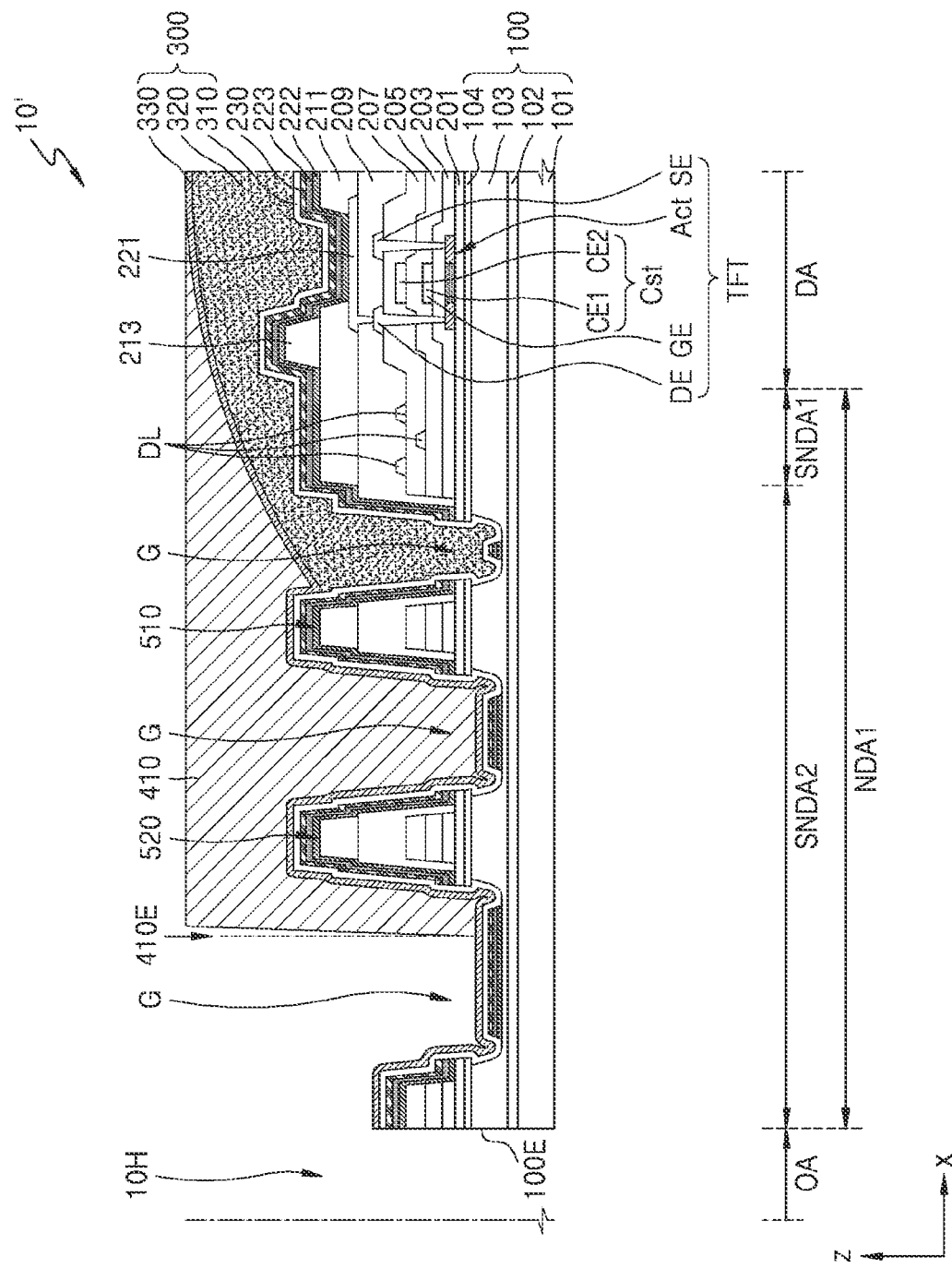
FIG. 17 is a cross-sectional view of a display panel according to an exemplary embodiment.

FIG. 17 is a cross-sectional view of a display panel 10' according to an exemplary embodiment.

The display panel 10' shown in FIG. 17 is different from the display panel 10 described above with reference to FIG. 9 in that it further includes a planarization layer 410. Hereinafter, a difference of the display panel 10' compared to the display panel 10 is mainly described for convenience of description.

The planarization layer 410 may include an organic insulating material. In an exemplary embodiment, the planarization layer 410 may be formed by coating a photoresist (a negative or positive photoresist) or a polymer-based organic material on the thin-film encapsulation layer 300 and patterning the same. An end 410E of the planarization layer 410 may be arranged on a vertical line that passes through one of grooves G as shown in FIG. 17. In an exemplary embodiment, the end 410E of the planarization layer 410 may be arranged on the same vertical line as an end 100E of the substrate 100.

The planarization layer 410 may improve flatness of the display panel 10 by covering an area of the second sub non-display area SNDA2 in which there is no organic encapsulation layer 320. Therefore, an input sensing member or an optical functional member that is directly formed on the display panel 10 or coupled on the display panel 10 by using an adhesive layer may be prevented from being separated or detached from the display panel 10.

The display panel according to the exemplary embodiments described herein may prevent a groove having an undercut cross-section from being damaged, and may prevent display elements from being damaged by foreign substances such as external moisture. However, these effects are provided as examples, and the scope of the present disclosure is not limited by these effects.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. A display panel, comprising:
   a substrate having a front surface, a rear surface, and an opening that passes from the front surface to the rear surface,
   a light emitting diode disposed in a display area surrounding the opening, the light emitting diode including a pixel electrode, an opposite electrode on the pixel electrode, and an intermediate layer between the pixel electrode and the opposite electrode;
   an encapsulation layer on the light emitting diode, the encapsulation layer comprising a first inorganic encapsulation layer, an organic encapsulation layer on the first inorganic encapsulation layer, and a second inorganic encapsulation layer on the organic encapsulation layer;
   a first groove in a non-display area between the display area and the opening and defined in the substrate;
   a second groove in the non-display area and spaced apart from the first groove; and
   a partition wall disposed between the first groove and the second groove in the non-display area,
   wherein the substrate comprises:
   a first base layer including the rear surface of the substrate;
   a first barrier layer on the first base layer;
   a second base layer on the first barrier layer; and
   a second barrier layer on the second base layer and including the front surface of the substrate, wherein
   the first groove has a shape substantially recessed into the second barrier layer and the second base layer,
   the second barrier layer has a first tip that protrudes toward the first groove beyond a first point at which a lateral surface of the second base layer and a bottom surface of the second barrier layer meet, and
   a length of the first tip is less than about 2 μm, and the length is a distance between the first point and a lateral surface of the first tip.

2. The display panel of claim 1, wherein the first groove is located between the display area and the partition wall, and the second groove is located between the partition wall and the opening of the substrate.

3. The display panel of claim 2, wherein:
   the second groove has a shape recessed into the second barrier layer and the second base layer,
   the second barrier layer has a second tip that protrudes toward the second groove beyond a second point at which a lateral surface of the second base layer, which faces the second groove, and a bottom surface of the second barrier layer meet, and
   a length of the second tip is less than about 2 μm, and the length is a distance between the second point and a lateral surface of the second tip.

4. The display panel of claim 3, wherein the length of the first tip or the second tip is about equal to or greater than about 0.3 μm and less than about 2 μm.

5. The display panel of claim 2, wherein a width of the first groove is less than a width of the second groove.

6. The display panel of claim 2, wherein a portion of the organic encapsulation layer extends to the non-display area and overlaps the first groove.

7. The display panel of claim 6, wherein a part of the organic encapsulation layer at least partially fills the first groove.

8. The display panel of claim 1, wherein a portion of the second inorganic encapsulation layer and a portion of the first inorganic encapsulation layer each extend to the non-display area, and are in direct contact with each other at a region corresponding a portion of an upper surface of the partition wall.

9. The display panel of claim 1, wherein a portion of the second inorganic encapsulation layer and a portion of the first inorganic encapsulation layer each extend to the non-display area, and are in direct contact with each other in the second groove.

10. The display panel of claim 1, wherein a first inorganic encapsulation layer continuously overlaps a top surface of the first tip, a lateral surface of the first tip, and the bottom surface of the first tip, and the lateral surface of the second base layer.

11. The display panel of claim 1, wherein a depth from the bottom surface of the second barrier layer to a bottom surface of the first groove is less than a thickness of the second base layer.

12. The display panel of claim 1, further comprising a planarization organic layer on the second inorganic encapsulation layer in the non-display area.

13. The display panel of claim 1, wherein the second base layer comprises a polymer resin and the second barrier layer comprises an inorganic material.

14. An electronic device comprising:
a display panel including an opening area, a display area surrounding the opening area, and a non-display area between the opening area and the display area, and
a component under the display panel, the component corresponding to the opening area,
wherein the display panel comprises:
a light emitting diode in the display area and including a pixel electrode, an opposite electrode on the pixel electrode, and an intermediate layer between the pixel electrode and the opposite electrode;
an encapsulation layer on the light emitting diode, the encapsulation layer comprising a first inorganic encapsulation layer, an organic encapsulation layer on the first inorganic encapsulation layer, and a second inorganic encapsulation layer on the organic encapsulation layer;
a first groove in the non-display area and defined in a multi-layer structure;
a second groove in the non-display area and defined in a multi-layer structure; and
a partition wall in the non-display area,
wherein the multi-layer structure comprises a first layer and a second layer on the first layer, and wherein:
the first groove has a shape substantially recessed into the second layer and the first layer,
the second layer has a first tip that protrudes toward the first groove beyond a first point at which a lateral surface of the first layer and a bottom surface of the second layer meet, and
a length of the first tip is less than about 2 μm, and the length is a distance between the first point and a lateral surface of the first tip.

15. The electronic device of claim 14, wherein the first groove is located between the display area and the partition wall, and the second groove is located between the partition wall and the opening of the substrate.

16. The electronic device of claim 15, wherein:
the second groove has a shape substantially recessed into the second barrier layer and the second base layer,
the second barrier layer has a second tip that protrudes toward the second groove beyond a second point at which a lateral surface of the second base layer, which faces the second groove, and a bottom surface of the second barrier layer meet, and
a length of the second tip is less than about 2 μm, and the length is a distance between the second point and a lateral surface of the second tip.

17. The electronic device of claim 16, wherein the length of the first tip or the second tip is about equal to or greater than about 0.3 μm and less than about 2 μm.

18. The electronic device of claim 14, wherein a portion of the organic encapsulation layer extends to the non-display area and overlaps the first groove.

19. The display panel of claim 18, wherein a width of the first groove is less than a width of the second groove.

20. The electronic device of claim 18, wherein a part of the organic encapsulation layer at least partially fills the first groove.

21. The electronic device of claim 14, wherein a portion of the second inorganic encapsulation layer and a portion of the first inorganic encapsulation layer extend to the non-display area, respectively, and are in direct-contact with each other in the second groove.

22. The electronic device of claim 14, wherein a portion of the second inorganic encapsulation layer and a portion of the first inorganic encapsulation layer each extend to the non-display area, and are in direct contact with each other at a region corresponding a portion of an upper surface of the partition wall.

23. The electronic device of claim 14, wherein a depth from the bottom surface of the second barrier layer to a bottom surface of the first groove is less than a thickness of the second base layer.

24. The electronic device of claim 14, wherein the display panel further comprises a transistor electrically connected to the light emitting diode, and
wherein the multi-layer structure is located in the display area and the non-display area, the multi-layer structure is below the transistor in the display area.

25. The electronic device of claim 24, wherein the first layer comprises a polymer resin and the second layer comprises an inorganic material.

26. The electronic device of claim 14, wherein the display panel further comprises a substrate, and wherein the multi-layer structure is located in the display area and the non-display area, and the multi-layer structure is below the transistor in the display area.

27. The electronic device of claim 14, wherein the component comprises a sensor or a camera.

* * * * *

UNITED STATES PATENT AND TRADEMARK OFFICE
CERTIFICATE OF CORRECTION

PATENT NO. : 11,974,456 B2
APPLICATION NO. : 17/817429
DATED : April 30, 2024
INVENTOR(S) : Wonwoo Choi et al.

It is certified that error appears in the above-identified patent and that said Letters Patent is hereby corrected as shown below:

In the Claims

Column 23, Lines 16-20 Claim 10 incorrectly states:
"wherein a first inorganic encapsulation layer continuously overlaps a top surface of the first tip, a lateral surface of the first tip, and the bottom surface of the first tip, and the lateral surface of the second base layer."

Should state:
"wherein a first inorganic encapsulation layer continuously overlaps a top surface of the first tip, the lateral surface of the first tip, and the bottom surface of the first tip, and the lateral surface of the second base layer."

Column 23, Lines 50-51 Claim 14 incorrectly states:
"a second groove in the non-display area and defined in a multi-layer structure;"

Should state:
"a second groove in the non-display area and defined in the multi-layer structure;"

Column 24, Lines 4-7 Claim 15 incorrectly states:
"wherein the first groove is located between the display area and the partition wall, and the second groove is located between the partition wall and the opening of the substrate."

Should state:
"wherein the first groove is located between the display area and the partition wall, and the second groove is located between the partition wall and the opening area."

Column 24, Lines 8-14 Claim 16 incorrectly states:
"the second groove has a shape substantially recessed into the second barrier layer and the second base layer, Signed and Sealed this
Eighth Day of October, 2024

*Katherine Kelly Vidal*

Katherine Kelly Vidal
*Director of the United States Patent and Trademark Office* the second barrier layer has a second tip that protrudes toward the second groove beyond a second point at which a lateral surface of the second base layer, which faces the second groove, and a bottom surface of the second barrier layer meet,"

Should state:
"the second groove has a shape substantially recessed into the second layer and the first layer,
the second layer has a second tip that protrudes toward the second groove beyond a second point at which a lateral surface of the first layer, which faces the second groove, and a bottom surface of the second layer meet,"

Column 24, Lines 40-43 Claim 23 incorrectly states:
"wherein a depth from the bottom surface of the second barrier layer to a bottom surface of the first groove is less than a thickness of the second base layer."

Should state:
"wherein a depth from the bottom surface of the second layer to a bottom surface of the first groove is less than a thickness of the first layer."

Column 24, Line 53 Claim 26 incorrectly states:
"The electronic device of claim 14"

Should state:
"The electronic device of claim 24,"